(12) United States Patent
Murata et al.

(10) Patent No.: US 7,601,235 B2
(45) Date of Patent: Oct. 13, 2009

(54) MANUFACTURING METHOD OF MULTILAYER CERAMIC BOARD

(75) Inventors: Takaki Murata, Kusatsu (JP); Yasutaka Sugimoto, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/877,971

(22) Filed: Oct. 24, 2007

(65) Prior Publication Data

US 2008/0128157 A1 Jun. 5, 2008

Related U.S. Application Data

(63) Continuation of application No. PCT/JP2006/319780, filed on Oct. 3, 2006.

(30) Foreign Application Priority Data

Nov. 25, 2005 (JP) ............................ 2005-340712
Jul. 11, 2006 (JP) ............................ 2006-190879

(51) Int. Cl.
C03B 29/00 (2006.01)
B32B 38/10 (2006.01)
H05K 3/46 (2006.01)

(52) U.S. Cl. ................................ 156/89.12; 156/89.11

(58) Field of Classification Search .............. 156/89.11, 156/89.12
See application file for complete search history.

(56) References Cited

U.S. PATENT DOCUMENTS

| | | | |
|---|---|---|---|
| 5,254,191 A | 10/1993 | Mikeska et al. | |
| 5,277,723 A | 1/1994 | Kodama et al. | |
| 5,387,474 A | 2/1995 | Mikeska et al. | |
| 5,474,741 A | 12/1995 | Mikeska et al. | |

(Continued)

FOREIGN PATENT DOCUMENTS

CN 1396675 A 2/2003

(Continued)

OTHER PUBLICATIONS

Official communication issued in the International Application No. PCT/JP2006/319780, mailed on Dec. 19, 2006.

(Continued)

*Primary Examiner*—Mark A Osele
(74) *Attorney, Agent, or Firm*—Keating & Bennett, LLP

(57) ABSTRACT

A method for manufacturing a multilayer ceramic board prevents damage to a wiring conductor formed on the surface of a multilayer ceramic board fabricated via a non-contraction process. On at least one principal surface of a layered body made up of a plurality of board ceramic green sheets including ceramic material powder, contraction prevention green sheets including inorganic material powder which is not sintered at the baking temperature of the board ceramic green sheet are arranged such that along at least a portion of the outer circumference of the principal surface, the portion and a nearby portion thereof are exposed to form a compound layered body, the compound layered body is baked under a condition in which the ceramic material powder is sintered, and the inorganic material powder is not sintered, following which the contraction prevention green sheets are removed. With a multilayer ceramic board, protruding portions are formed along at least a portion of the outer circumference of a principal surface.

16 Claims, 10 Drawing Sheets

U.S. PATENT DOCUMENTS

| | | |
|---|---|---|
| 6,646,608 B2 | 11/2003 | Yoneda |
| 6,942,833 B2 * | 9/2005 | Kawakami et al. .......... 264/672 |
| 2003/0006855 A1 | 1/2003 | Yoneda |

FOREIGN PATENT DOCUMENTS

| | | |
|---|---|---|
| JP | 2001-111223 A | 4/2001 |
| JP | 2001-351802 A | 12/2001 |
| JP | 2003-055055 A | 2/2003 |
| JP | 2003077756 A * | 3/2003 |

OTHER PUBLICATIONS

Official communication issued in counterpart Korean Application No. 10-2007-7017682, mailed on Aug. 29, 2008.

English Translation and copy of official communication issued in Chinese Application No. 2006800062266, mailed on Jun. 26, 2009.

* cited by examiner

MANUFACTURING METHOD OF MULTILAYER CERAMIC BOARD

BACKGROUND OF THE INVENTION

1. Field of the Invention

The present invention relates to a method for manufacturing a multilayer ceramic board.

2. Description of Related Art

As for a method for manufacturing a multilayer ceramic board, a so-called non-contraction process is known wherein a contraction prevention layer whose principal component is alumina or the like is adhered to both upper and lower both principal surfaces of an unbaked multilayer ceramic member formed by layering a ceramic green sheet that can be baked at a low temperature and a wiring conductor made up of a low melting point metal, and these are baked at the baking temperature of a multilayer ceramic member, following which an unsintered contraction prevention layer is removed (e.g., see Japanese Unexamined Patent Application Publication No. 4-243978.

A technique for forming a protrusion on the principal surface of a multilayer ceramic board fabricated with the non-contraction process has been disclosed in Japanese Unexamined Patent Application Publication No. 2001-111223. This protrusion can be used as a spacer at the time of mounting an electronic component, such as reinforcing a via hole conductor protruding on the principal surface of a multilayer ceramic board, or forming it as a rib-like protrusion, so as to prevent the outflow of resin or solder, or to serve as the side wall of a cavity.

According to a non-contraction process, contraction in the planar direction (X-Y direction) perpendicular to the layering direction (Z direction) can be prevented, whereby a multilayer ceramic board having high dimensional accuracy can be fabricated.

However, although such a multilayer ceramic board having high dimensional accuracy can be fabricated, in the event of forming a wiring conductor on the surface of this board, the wiring conductor is formed in a state of protruding from the board surface, resulting in a problem wherein the wiring conductor of the board surface becomes separated due to wear.

Also, with the multilayer ceramic board described in Japanese Unexamined Patent Application Publication No. 2001-111223, there is a disclosure regarding a wall-like protrusion being formed, but this protrusion is only formed inside the outer circumference of the board, and accordingly, there is a problem wherein the portion of the board surface side where a wiring conductor can be formed is narrow.

SUMMARY OF THE INVENTION

In order to overcome the problems described above, preferred embodiments of the present invention provide a method for manufacturing a multilayer ceramic board whereby a wiring conductor formed on the surface of the multilayer ceramic board can be prevented from becoming damaged.

A method for manufacturing a multilayer ceramic board includes the steps of (a) disposing, on at least one principal surface of a layered body including a plurality of board ceramic green sheets including ceramic material powder, a contraction prevention green sheet including inorganic material powder which is not sintered at the baking temperature of the board ceramic green sheet to form a compound layered body (hereafter, referred to as "compound layered body forming step"); (b) baking the compound layered body under a condition in which the ceramic material powder is sintered, and the inorganic material powder is not sintered (hereafter, referred to as "baking step"); and (c) a step for removing the contraction prevention green sheet which has not been sintered from the compound layered body. The compound layered body forming step includes a step for disposing the contraction prevention green sheet such that of the surface of the board ceramic green sheet of the layered body which is in contact with the contraction prevention green sheet, along at least of a portion of the outer circumference of the surface, the portion and a nearby portion thereof are not directly in contact with the contraction prevention green sheet. In the baking step, with at least one principal surface of the layered body, along at least a portion of the outer circumference, a protruding portion which protrudes in the vertical direction of the principal surface as compared with the other portions is formed at the portion and the nearby portion thereof.

According to the manufacturing method, in the baking process, the board ceramic green sheet of the layered body is contracted due to baking, but the contraction prevention green sheet is not sintered, and is substantially not contracted. Therefore, with the layered body, contraction in the surface direction of the portion which is in contact with the contraction prevention green sheet is prevented, so the portion which is in contact with the contraction prevention green sheet is roughly contracted only in one direction which is perpendicular or substantially perpendicular to the surface (i.e., layering direction). On the other hand, of the surface of the board ceramic green sheet of the layered body which is in contact with the contraction prevention green sheet, the portion adjacent to at least a portion of the outer circumference of the surface is not directly in contact with the contraction prevention green sheet and so is not restrained, and is contracted three-dimensionally. Therefore, with the unrestrained portion which is not directly in contact with the contraction prevention green sheet, the contraction ratio of the direction perpendicular to the surface (i.e., layering direction) becomes small as compared with contraction in one direction, so the unrestrained portion becomes a state of protruding in the direction perpendicular to the surface (i.e., layering direction) as compared with the portion of the layered body which is in contact with the contraction prevention green sheet due to the difference of the contraction ratio in the direction perpendicular to the surface (i.e., layering direction). Consequently, a protrusion portion protruding as compared with the other portions can be formed on a portion of the outer circumference and the nearby portion thereof on the principal surface of the layered body after baking, i.e., the principal surface of the multilayer ceramic board.

In the event that the multilayer ceramic board thus manufactured is disposed on the surface with the protruding portion being turned down, the portions other than the protruding portion on the board principal surface are in a state of floating up from the surface, whereby a problem such as the wiring conductor formed on the portion other than this protruding portion becomes separated due to wear can be prevented.

A preferred embodiment of the present invention is provided such that in the compound layered body forming step, the contraction prevention green sheet is disposed such that, of the surface of the board ceramic green sheet of the layered body which is in contact with the contraction prevention green sheet, along at least of a portion of the outer circumference of the surface, that portion and a nearby portion thereof are exposed.

In this case, the exposing portion of the surface of the board ceramic green sheet which is in contact with the contraction prevention green sheet is spaced apart from the contraction prevention green sheet, and is not directly in contact with the contraction prevention green sheet.

Preferably, in the compound layered body forming step, the compound layered body is formed in a grouped state. In the compound layered body forming step, on the surface of the board ceramic green sheet of the layered body in a grouped state, which is in contact with the contraction prevention green sheet, the contraction prevention green sheet is arranged such that a weakening portion, which is formed along at least a portion of dividing lines for dividing the layered body in a grouped state into individual pieces, for weakening the junction strength between the pieces, and the nearby portion thereof are exposed.

In this case, no contraction prevention green sheet is disposed on the weakening portion formed on the layered body in a grouped state, and the exposing portion at the nearby portion thereof, so in the baking step, deformation around the exposing portion is not restrained, and is deformed three-dimensionally. If the weakening portion is formed as appropriate, for example, in the baking step a portion near the exposing portion is contracted and deformed toward the both sides of the weakening portion, whereby the layered body can be separated with the weakening portion as a boundary. Thus, a multilayer ceramic board can be manufactured effectively in a grouped state.

Note that the weakening portion is a portion where the junction strength between individual pieces is weakened, but this junction is not restricted to applying force from one side to the other side of adjacent individual pieces to obtain a junction, let us say that this includes, for example, a case wherein force is applied from above as to a plurality of individual pieces disposed on a plane, whereby adjacent individual pieces are in contact with each other, or contact each other. Further, in the event that the junction strength between individual pieces is zero, e.g., even in the event that an area between individual pieces is separated, this is included in the weakening portion mentioned here.

Preferably, in the compound layered body forming step, on the surface of the board ceramic green sheet of the layered body in a grouped state, which is in contact with the contraction prevention green sheet, the contraction prevention green sheet is disposed apart from the dividing lines.

In this case, of the surface of the board ceramic green sheet of the layered body in a grouped state which is in contact with the contraction prevention green sheet, along the entire circumference of the individual pieces in the layered body in a grouped state, the contraction prevention green sheet is disposed such that the entire circumference and the nearby portion thereof are exposed. Thus, the protruding portion continuing in a wall shape along the entire circumference of the principal surface of the multilayer ceramic board can be formed.

Preferably, in the compound layered body forming step, after dividing the layered body formed in a grouped state along the dividing lines, the weakening portion is formed by subjecting the layered body to pressure-bonding in the layering direction of the layered body.

In this case, with the layered body in a grouped state, the portion joined after being divided becomes the weakening portion. That is to say, the layered body in a grouped state can be readily divided at the portion joined after being divided in the baking step or following baking.

More preferably, in the compound layered body forming step, following a first whole restraint green sheet being arranged so as to cover the contraction prevention green sheet disposed on the one principal surface, the layered body is divided along the dividing lines. Next, a second whole restraint green sheet is disposed at the other principal surface side of the layered body, and is subjected to pressure-bonding, thereby forming the compound layered body having the weakening portion.

In this case, in the compound layered body forming step, the compound layered body to which the first and second whole restraint green sheets are pressure-bonded is formed. Even if the layered body is divided along the dividing lines in the compound layered body forming step, the first whole restraint green sheet prevents the individual pieces from separating, thereby facilitating handling in the manufacturing steps.

Preferably, in the compound layered body forming step, a groove is formed from one principal surface or both principal surfaces of the layered body on the layered body in a grouped state along the dividing lines, thereby forming the weakening portion.

In this case, the groove formed in the layered body in a grouped state becomes the weakening portion. That is to say, the layered body in a grouped state can be readily divided around the groove in the baking step, or after baking.

Preferably, the dividing lines are arranged in the longitudinal direction and in the transversal direction so as to mutually intersect.

The individual pieces are arranged in a lattice shape on the compound layered body in a grouped state, whereby a multilayer ceramic board can be effectively manufactured.

Preferably, in the compound layered body forming step, the contraction prevention green sheet is arranged about 10 μm to about 5 mm apart from the dividing line.

In the event that the contraction prevention green sheet is disposed less than about 10 μm apart from the dividing line, the board ceramic green sheet has a small exposure area, and accordingly, it is difficult to form the protruding portion having a height sufficient for protecting the wiring conductor formed on the principal surface of the multilayer ceramic board. On the other hand, in the event that the contraction prevention green sheet is disposed more than about 5 mm apart from the dividing line, the board ceramic green sheet is too exposed, and is contracted greatly in the surface direction, and accordingly, the dimensional accuracy of the multilayer ceramic board deteriorates.

Another preferred embodiment is provided such that in the compound layered body forming step, the contraction prevention green sheet is disposed, of the surface of the board ceramic green sheet of the layered body which is in contact with the contraction prevention green sheet, along at least of a portion of the outer circumference of the surface on the portion and a nearby portion thereof via a protruding portion forming layer made up of material which is burned up at the baking temperature of the board ceramic green sheet.

In this case, the board ceramic green sheet is indirectly in contact with the contraction prevention green sheet via the protruding portion forming layer before baking. The protruding portion forming layer disposed at the interface between the board ceramic green sheet and the contraction prevention green sheet is burnt away in the baking step, and accordingly, a partial cavity can be formed at the interface between the board ceramic green sheet and the contraction prevention green sheet. Note that burning away means that the shape of the protruding portion forming layer is eliminated in the baking step, for example, the protruding portion forming layer is burnt away, or decomposed. The board ceramic green sheet is not in contact with the contraction prevention green sheet at the cavity portion, and accordingly, the contraction prevention force of the contraction prevention green sheet is not affected on the board ceramic green sheet. Therefore, with the board ceramic green sheet, in the baking step, the portion which is in contact with the protruding portion forming layer is not subjected to restraint, and is contracted three-dimensionally, thereby forming the protruding portion.

It is unnecessary to subject the contraction prevention green sheet to processing, so rather than the case wherein the contraction prevention green sheet is processed, design flexibility becomes high and process cost can also be reduced.

Preferably, in the compound layered body forming step, the compound layered body is formed in a grouped state. The protruding portion forming layer is formed on at least a portion and the nearby portion of dividing lines for dividing the layered body in a grouped state into individual pieces, of the interface between the board ceramic green sheet of the layered body in a grouped state and the contraction prevention green sheet.

In this case, the multilayer ceramic board can be effectively manufactured in a grouped state.

Preferably, in the compound layered body forming step, following dividing the layered body formed in a grouped state along the dividing lines, the layered body formed in a grouped state is subjected to pressure-bonding in the layering direction of the layered body.

In this case, the layered body in a grouped state can be readily divided at the portion joined after being divided in the baking step, or after baking.

Preferably, the dividing lines are arranged in the longitudinal direction and in the transversal direction so as to mutually intersect.

The individual pieces are arranged in a latticed shape on the compound layered body in a grouped state, whereby the multilayer ceramic board can be effectively manufactured.

Preferably, in the compound layered body forming step, the protruding portion forming layer is arranged in a range of about 10 µm to about 5 mm from the dividing line.

In the event that the contraction prevention green sheet is disposed less than about 10 µm apart from the dividing line, the board ceramic green sheet has a small exposure area, and accordingly, it is difficult to form the protruding portion having a height that is sufficient to protect the wiring conductor formed on the principal surface of the multilayer ceramic board. On the other hand, in the event that the contraction prevention green sheet is disposed more than about 5 mm apart from the dividing line, the contraction prevention green sheet is too exposed, and is contracted greatly in the surface direction, and accordingly, the dimensional accuracy of the multilayer ceramic board deteriorates.

Preferably, the protruding portion forming layer is formed with carbon paste.

Even if carbon paste is burned away in the baking step, this does not have adverse effects on the board ceramic green sheet.

With the respective preferred embodiments, preferably, the protruding portion is formed on at least one side of at least one principal surface of the multilayer ceramic board, and the nearby portion thereof. The protruding portion protrudes about 1 µm to about 1 mm in the vertical direction of the principal surface as compared with the other portion of at least the one principal surface of the multilayer ceramic board.

In the event that the height of the protruding portion is less than about 1 µm, it is too low to protect the wiring conductor formed on the principal surface of the multilayer ceramic board. On the other hand, in the event that the height of the protruding portion exceeds about 1 mm, the strength of the protruding portion becomes weak, resulting in a problem wherein the protruding portion is lost, which is undesirable.

Also, another preferred embodiment of the present invention provides a multilayer ceramic board having the following configuration.

The multilayer ceramic board is preferably a type that includes a plurality of ceramic layers, wiring conductors are formed between the different ceramic layers, and the wiring conductors are connected with a via conductor. With at least one principal surface of the multilayer ceramic board, along at least a portion of the outer circumference on the portion and the nearby portion thereof, the multilayer ceramic board includes a protruding portion protruding in the vertical direction of the principal surface as compared with the other portions.

According to the above configuration, in the event that the multilayer ceramic board is disposed on the surface with the protruding portion being turned down, the portions other than the protruding portion on the board principal surface become a state of floating from the surface, whereby a problem such as the wiring conductor formed on the portion other than this protruding portion being separated due to wear or the like can be prevented. Also, in the event that the multilayer ceramic board is mounted on another board, or is accommodated in a package, the multilayer ceramic board can be positioned using the protruding portion.

Preferably, with at least the one principal surface of the multilayer ceramic board, there is provided the protruding portion which is continuous along the entire circumference of the outer circumference.

In this case, the wiring conductors exposed on the principal surface of the multilayer ceramic board can be protected by the protruding portion in a reliable manner. Also, in the event that the multilayer ceramic board is mounted on another board, or is accommodated in a package, the multilayer ceramic board can be readily positioned in a reliable manner using the protruding portion.

Preferably, the protruding portion is formed on both principal surfaces of the multilayer ceramic board.

In this case, the wiring conductors formed on both principal surfaces of the multilayer ceramic board can be protected with the protruding portion, thereby facilitating handling of the multilayer ceramic board.

Preferably, the protruding portion protrudes about 1 µm to about 1 mm in the vertical direction of the principal surface as compared with the other portions of the principal surface of the multilayer ceramic board.

In the event that the protruding height of the protruding portion is less than about 1 µm, it is too low to protect the wiring conductors formed on the other portions of the principal surface of the multilayer ceramic board. On the other hand, in the event that the protruding height of the protruding portion exceeds about 1 mm, the strength of the protruding portion becomes weak, resulting in a problem wherein the protruding portion is lost, which is undesirable.

Preferably, at least one side of the multilayer ceramic board is substantially a plane.

According to the above configuration, in the event that an external electrode is formed at the side which is substantially a plane of the multilayer ceramic board, the external electrode having high dimensional accuracy can be formed.

Preferably, the side adjacent to the protruding portion of the multilayer ceramic board is substantially a plane.

According to the above configuration, in the event that an external electrode is formed at the side which is substantially a plane of the multilayer ceramic board, the external electrode having high dimensional accuracy can be formed. Also, it is easy to manufacture the multilayer ceramic board such that the side adjacent to the protruding portion is substantially a plane.

Preferably, an external electrode is formed at the side that is substantially a plane.

In this case, it is easy to form an external electrode at the side which is substantially plane of the multilayer ceramic board, and an external electrode having high dimensional accuracy can be formed.

Also, preferred embodiments of the present invention are configured with the multilayer ceramic board having any one of the above configurations, and provide a nonreciprocal circuit element including a permanent magnet; a center electrode assembly to which a DC magnetic field is applied by the permanent magnet, including a base, a plurality of center electrodes disposed by being accumulated on the base with a predetermined intersection angle, and an electrical insulation layer disposed between the center electrodes for electrically insulating between the center electrodes; a metal case for accommodating the permanent magnet and the center electrode assembly; and a ceramic board on which the center electrode assembly is mounted, and a capacitor element and a resistance element are provided.

According to the above configuration, the multilayer ceramic board includes the protruding portion, and utilizing this protruding portion facilitates the positioning when the multilayer ceramic board is fitted into a metal case, or when combining between the center electrode assembly and the permanent magnet, whereby positioning can be performed with high accuracy. Further, in the event that the side of the multilayer ceramic board is a plane, forming an electrode on this side facilitates connection with the outer-side metal case using solder.

According to various preferred embodiments of the present invention, with regard to a multilayer ceramic board fabricated with a non-contraction process, a wiring conductor formed on the surface of the multilayer ceramic board can be prevented from being damaged.

Other features, elements, steps, characteristics and advantages of the present invention will be described below with reference to preferred embodiments thereof and the attached drawings.

DETAILED DESCRIPTION OF PREFERRED EMBODIMENTS

Description will be made below regarding preferred embodiments of the present invention with reference to FIG. 1 through FIG. 9.

First Preferred Embodiment

Description will be made regarding a method for manufacturing a multilayer ceramic board according to a first preferred embodiment of the present invention with reference to FIG. 1 through FIG. 9. With the first preferred embodiment, a portion of the principal surface of a layered body of a board ceramic green sheet serving as a multilayer ceramic board is baked in a state of being exposed from a contraction prevention green sheet, thereby manufacturing a multilayer ceramic board. A multilayer ceramic board can be manufactured one at a time such as with the later-described Example 1, but now, description will be made regarding a case wherein a plurality of boards are simultaneously manufactured in a grouped state, such as with the later-described Example 2, as an example.

First, description will be made regarding the outline of a method for manufacturing a multilayer ceramic board 10 in a grouped state with reference to the cross-sectional views in FIGS. 7A-7F.

Figure 7A:
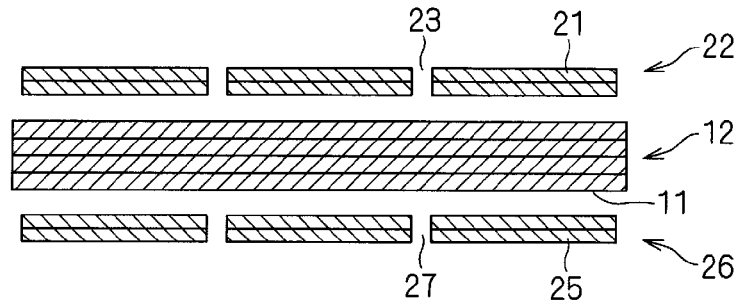
FIGS. 7A-7F are explanatory diagrams of the manufacturing process of the multilayer ceramic board. (Example 2)

As shown in FIG. 7A, a base layer 12 serving as a layered body which layers a plurality of board ceramic green sheets 11, and restraint layers 22 and 26 including one or two or more contraction prevention green sheets 21 and 25 are prepared.

The board ceramic green sheet 11 used for the base layer 12 is an unsintered green sheet which was molded in a sheet shape, and includes ceramic material powder. With the board ceramic green sheet 11, a through hole (not shown) is processed with laser processing, punching processing, or the like at an appropriate position, and conductor paste is embedded in this through hole by printing or the like, thereby disposing a via conductor (not shown). Also, a wiring conductor (not shown) is disposed on one principal surface of the board ceramic green sheet 11 by printing conductor paste using a screen printing method or gravure printing method or the like, or by transferring a metallic foil having the shape of a predetermined pattern, or the like.

The contraction prevention green sheets 21 and 25 serving as the restraint layers 22 and 26 are unsintered green sheets molded in a sheet shape. The contraction prevention green sheets 21 and 25 include inorganic material powder such as alumina or the like which is not sintered at the baking temperature of the board ceramic green sheet 11, and are not substantially sintered at the sintering temperature of the board ceramic green sheet 11.

Gaps 23 and 27 are formed in the restraint layers 22 and 26 along at least a portion of the dividing lines for dividing corresponding to the individual pieces of the multilayer ceramic board 10.

The contraction prevention green sheets 21 and 25 are cut by laser into the size of one individual piece to be layered, and can be fabricated by layering in a layered body in a grouped state. The contraction prevention green sheets 21 and 25 may be formed by being cut using a dicing saw or knife edge, or by being punched out using a puncher. Also, slurry for fabricating the contraction prevention green sheets 21 and 25 may be screen-printed on the layered body in a grouped state. Further, the contraction prevention green sheet may be formed on a support, and subsequently may be transferred and formed on the layered body in a grouped state. At this time, the contraction prevention green sheet may be formed over the entire surface on the support, and then unnecessary portions are removed with a laser or the like, for example, thereby forming the size of one individual piece to be layered.

Also, an arrangement may be made wherein a temporarily pressure-bonded layered body is fabricated, following which the contraction prevention green sheets 21 and 25 are layered thereupon, and are further subjected to temporary pressure-bonding, or an arrangement may be made wherein the board ceramic green sheet 11 and the contraction prevention green sheets 21 and 25 are layered, following which are subjected to temporary pressure-bonding to fabricate a compound layered body.

Figure 7B:
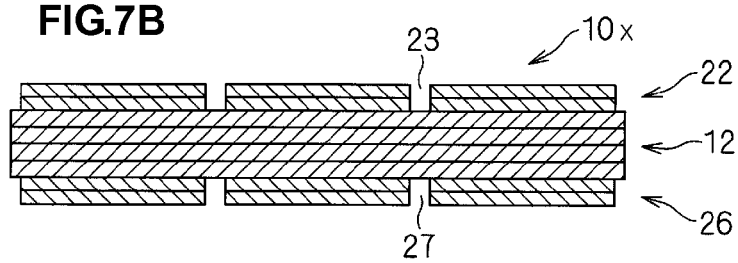

Next, as shown in FIG. 7B, the restraint layers 22 and 26 are layered on both principal surfaces of the base layer 12, relatively small pressure is applied in the layering direction, and the restraint layers 22 and 26 are subjected to temporary pressure-bonding as to the base layer 12 to form a temporarily pressure-bonded compound layered body 10x.

Note that an arrangement may be made wherein the restraint layers 22 and 26 are layered on the temporarily pressure-bonded base layer 12, and are subjected to temporary pressure-bonding, or an arrangement may be made wherein the restraint layers 22 and 26 are disposed on the principal surfaces of the plurality of layered ceramic green sheets 11, following which all the green sheets are subjected to temporary pressure-bonding together. Further, an arrangement may be made wherein the restraint layers 22 and 26 are subjected to temporary pressure-bonding on the ceramic green sheets 11, following which are layered on the temporarily pressure-bonded base layer 12, and are subjected to temporary pressure-bonding, or an arrangement may be made wherein the restraint layers 22 and 26 are disposed on the principal surfaces of the plurality of ceramic green sheets 11, and are subjected to temporary pressure-bonding.

Figure 7C:
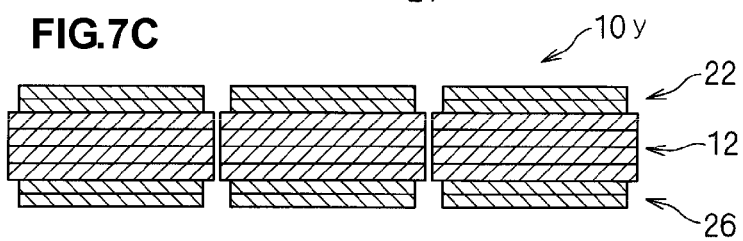

Subsequently, as shown in FIG. 7C, the compound layered body 10x in which the restraint layers 22 and 26 are temporarily pressure-bonded to the base layer 12 is divided along dividing lines for dividing corresponding to the individual pieces of the multilayer ceramic board 10 to form divided compound layered bodies 10y.

Figure 7D:
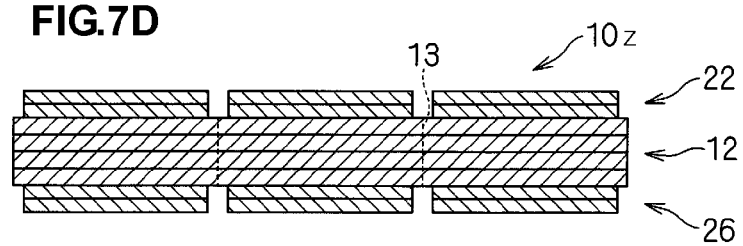

Subsequently, the divided compound layered bodies 10y, as shown in FIG. 7D, are subjected to relatively great pressure in the layering direction in a state in which the divided surfaces 13 are facing each other and joined together, and the restraint layers 22 and 26 are fully pressure-bonded to the base layer 12 to form a fully pressure-bonded compound layered body 10z.

Figure 7E:
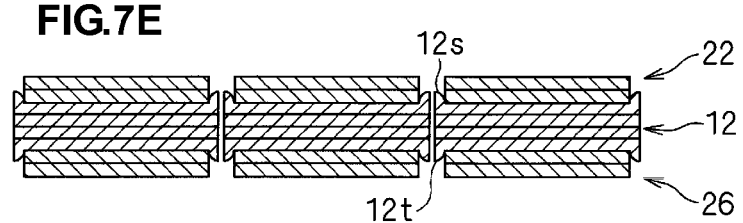

Subsequently, the compound layered body 10z in which the restraint layers 22 and 26 are fully pressure-bonded to the base layer 12 is subjected to baking. Baking is performed under a condition wherein the ceramic material powder included in the board ceramic green sheet 11 of the base layer 12 is sintered, and the inorganic material powder included in the contraction prevention green sheets 21 and 25 of the restraint layers 22 and 26 are not sintered. That is to say, the compound layered body 10z is subjected to baking at a temperature that is higher than the baking temperature of the board ceramic green sheet 11 of the base layer 12, and also lower than the baking temperature of the contraction prevention green sheets 21 and 25 of the restraint layers 22 and 26. As shown in FIG. 7E, the base layer 12 is formed with protruding portions 12s and 12t at the portions where the restraint layers 22 and 26 are not subjected to pressure-bonding, and also is separated at the divided surfaces 13.

Figure 7F:
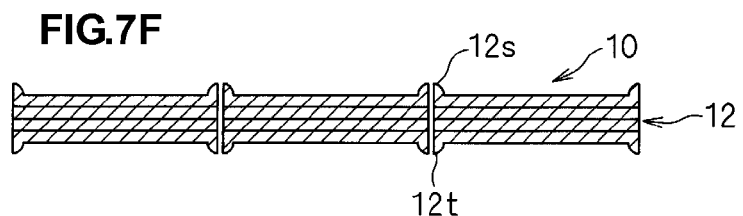

Subsequently, the restraint layers 22 and 26 are removed from the baked base layer 12 and restraint layers 22 and 26, thereby extracting baked multilayer ceramic boards 10 shown in FIG. 7F. The wiring conductors disposed between the board ceramic green sheet 11 of the base layer 12 and the contraction prevention green sheets 21 and 25 of the restraint layers 22 and 26 are exposed from the principal surfaces of the multilayer ceramic boards 10. The multilayer ceramic boards 10 include a plurality of ceramic layers formed with the board ceramic green sheet 11, wiring conductors are formed between ceramic layers, and the wiring conductors are connected with a via conductor.

Next, description will be further made regarding forming of the protruding portions 12s and 12t, and separation of the base layer 12 with reference to FIG. 1 through FIG. 6B.

The base layer 12 starts contraction due to baking, but at this time, the restraint layers 22 and 26 are not sintered, so they are not contracted. Therefore, as shown in the cross-sectional view in FIG. 1, with the base layer 12, contraction in the surface direction (X-Y direction) is prevented at the portion to which the restraint layers 22 and 26 are pressure-bonded, as shown with an arrow 16, and is greatly contracted only in the layering direction (Z direction). On the other hand, deformation in the surface direction (X-Y direction) is not restrained at the portion to which the restraint layers 22 and 26 are not pressure-bonded, so that portion can be contracted in the X direction shown with an arrow 18, and in the Y direction perpendicular to the space, and contraction in the Z direction shown with an arrow 17 is reduced, which is equivalent to the amount of that contraction. That is to say, the difference in the amount of contraction in the layering direction of the base layer 12 is caused depending on the presence of pressure-bonding of the restraint layers 22 and 26.

Figure 3:
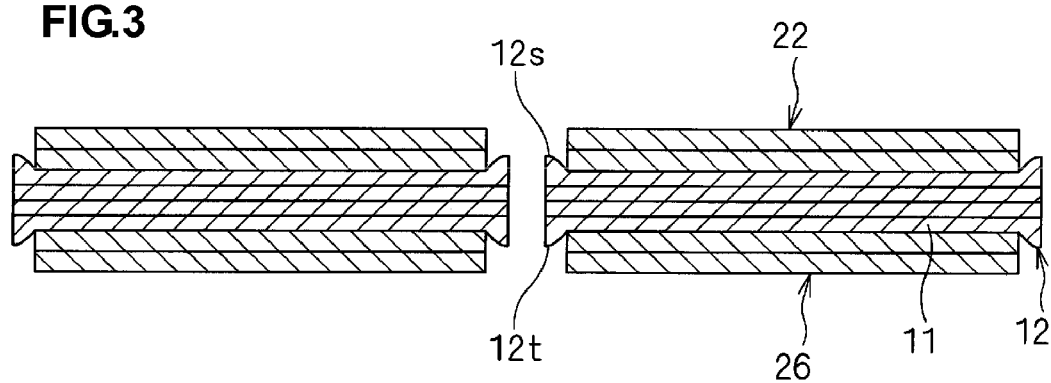
FIG. 3 is a cross-sectional view of the compound layered body after baking.

As shown in the cross-sectional view in FIG. 3, the dimension in the layering direction of the base layer 12 becomes relatively small at the portion to which the restraint layers 22 and 26 are pressure-bonded due to such difference of the contraction behavior of the base layer 12, and becomes relatively great at the portion to which the restraint layers 22 and 26 are not pressure-bonded. Consequently, with the base layer 12, the protruding portions 12s and 12t are formed at the portion to which the restraint layers 22 and 26 are not pressure-bonded.

Figure 1:
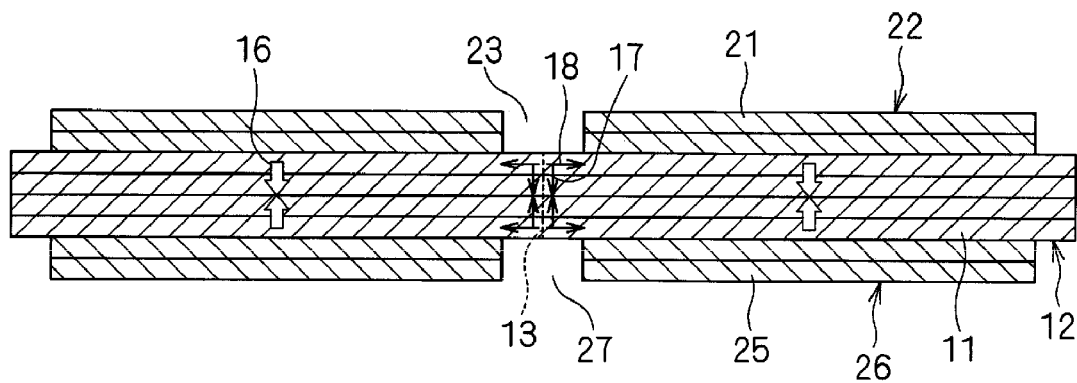
FIG. 1 is a cross-sectional view schematically illustrating the configuration of a compound layered body before baking.

Further, as shown in FIG. 1, in the event that there is the divided surface 13 at the portion to which the restraint layers 22 and 26 are not pressure-bonded, with both sides of the divided surface 13, the base layer 12 is contracted in the direction apart from the divided surface 13 as shown with the arrow 18. The base layer 12 is divided at the divided surface 13, and then joined, so the composition thereof becomes discontinuous as to the other portions, and the strength in the joint direction is weak as compared with the other portions. Therefore, as shown in FIG. 3, the base layer 12 is separated at the divided surface 13 during baking or after baking. Or, the base layer 12 is readily separated after baking.

Note that in order to realize such a separation, the restraint layers 22 and 26 are configured so as to keep the relative positions of both-side portions via the gaps 23 and 27 during baking. For example, an arrangement is made wherein the gaps 23 and 27 are formed intermittently such that the restraint layers 22 and 26 are not separated at the gaps 23 and 27, and also the restraint layers 22 and 26 are continuous around the gaps 23 and 27. Alternatively, an arrangement is made wherein the restraint layers 22 and 26 are formed with the contraction prevention green sheets 21 and 25 made up of a plurality of layers, and at least one layer other than the contraction prevention green sheets 21 and 25 which are pressured-bonded to the base layer 12 is formed in a continuous form where the gaps 23 and 27 are not formed.

The base layer 12 is separated during baking or after baking, or is readily separated after baking, whereby the step of dividing the board after baking can be reduced. Or, the burden of the dividing work can be reduced.

Figure 2:
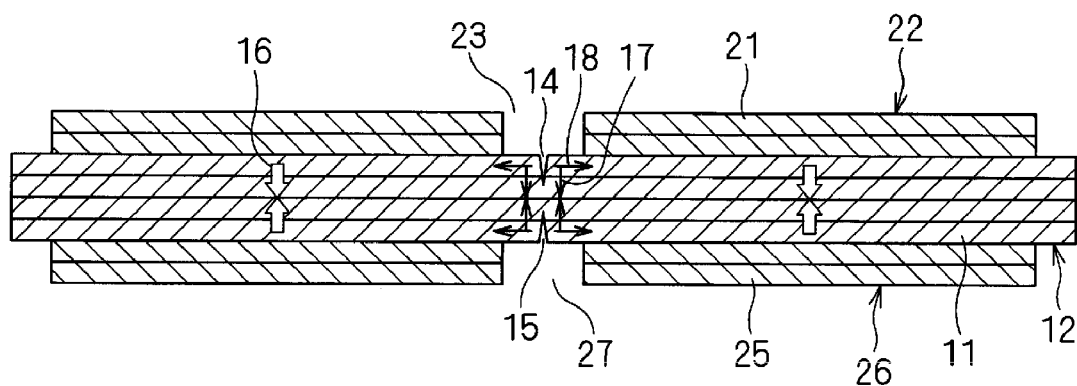
FIG. 2 is a cross-sectional view schematically illustrating the configuration of a compound layered body before baking.

As described above, instead of baking after being joined at the divided surface 13, as shown in the cross-sectional view in FIG. 2, dividing grooves 14 and 15 are formed in the base layer 12, whereby the base layer 13 is automatically separated along with baking even if the base layer 12 is not divided before baking. The dividing grooves 14 and 15 are formed at the portion of the base layer 12 to which the restraint layers 22 and 26 are not pressure-bonded generally in the layering direction to the middle from both principal surfaces. Note that only one of the dividing grooves 14 and 15 may be formed in the base layer 12.

The portion of the base layer 12 to which the restraint layers 22 and 26 are not pressure-bonded is contracted in the direction apart from the dividing grooves 14 and 15 such as shown with the arrow 18 at both sides of the dividing grooves 14 and 15 along with baking, so the base layer 12 is separated at the portion where the cross-section between the dividing grooves 14 and 15 is reduced, and also as with the case in FIG. 1, the protruding portions 12s and 12t are formed at the portion of the base layer 12 to which the restraint layers 22 and 26 are not pressure-bonded as shown in FIG. 3.

As shown in FIG. 2, even in the event that the dividing grooves 14 and 15 are formed in the base layer 12, the base layer 12 is readily divided into child boards along the dividing grooves 14 and 15, whereby the burden for dividing the board can be reduced.

Figure 4A:
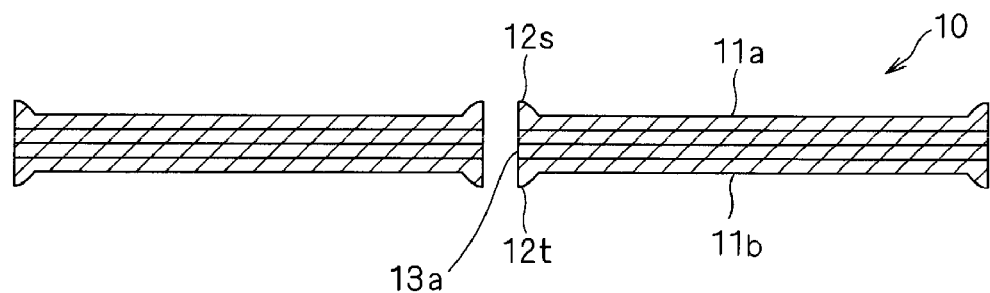
FIGS. 4A, 4B and 4C are cross-sectional views of a multilayer ceramic board.
Figure 4B:
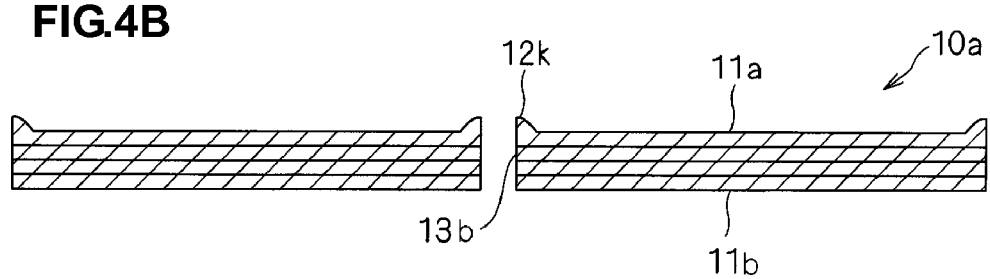

As shown in the cross-sectional view in FIG. 4A, even if the protruding portions 12s and 12t are formed on both principal surfaces 11a and 11b of the multilayer ceramic board 10, a protruding portion 12k may be formed only on one principal surface 11a of a multilayer ceramic board 10a, as shown in the cross-sectional view in FIG. 4B. On the other hand, in the event that the protruding portion 12k is formed only on the one principal surface 11a, a restraint layer which is pressured-bonded to the other principal surface 11b is arranged so as to be continuous even at the portion of the dividing line. Alternatively, a tool which can be replaced with the restraint layer may be pressure-bonded to the other principal surface 11b.

Figure 4C:
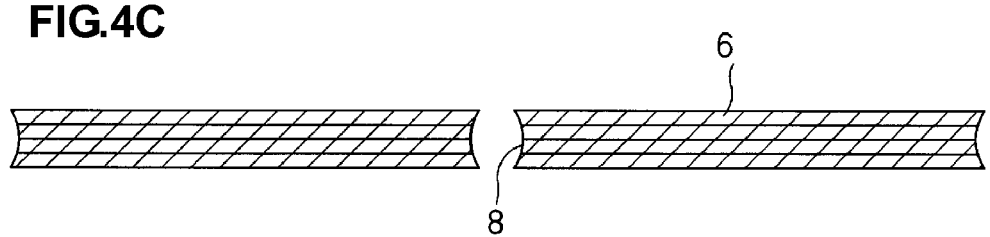

Even if a base layer 6 is divided and joined, in the event that no gap is provided along a dividing line in the restraint layer which is pressure-bonded to both principal surfaces of the base layer 6, as shown in the cross-sectional view in FIG. 4C, the side 8 of the base layer 6 after baking curves. On the other hand, as shown in FIGS. 4A and B, in the event that a gap is provided along a dividing line in the restraint layer, and the protruding portions 12s, 12t, and 12k are formed, the sides 13a and 13b of the multilayer ceramic boards 10 and 10a become roughly a plane shape. Therefore, in the event of forming an external electrode at these sides 13a and 13b, the dimensional accuracy thereof can be improved.

With the multilayer ceramic boards 10 and 10a, the protruding portions 12s, 12t, and 12k are protruding from the board principal surfaces 11a and 11b, so for example, when the multilayer ceramic boards 10 and 10a are disposed on another component with the protruding portions 12s, 12t, and 12k being faced down, wiring conductors (not shown) such as surface electrodes, wiring, and so forth formed on the board principal surfaces 11a and 11b become a state of floating from the other components, and accordingly, it becomes difficult to contact with other components. Therefore, a problem such as separation and so forth along with rubbing of wiring conductors such as surface electrodes, wiring, and so forth formed on the board principal surfaces 11a and 11b can be prevented.

Also, in the event that the multilayer ceramic boards 10 and 10a are stored in a package or the like, the protruding portions 12s, 12t, and 12k are fitted in or engaged with or the like, whereby positioning and fixing can be readily performed.

Note that regardless of whether the protruding portions 12s, 12t, and 12k are formed continuously along a dividing line, or formed intermittently, the above advantages can be obtained.

The protruding portions 12s, 12t, and 12k preferably protrude by about 1 μm to about 1 mm as compared with the center portion of the board principal surfaces 11a and 11b of the multilayer ceramic boards 10 and 10a. In the event that the protruding height of the protruding portions 12s, 12t, and 12k is less than about 1 μm, this is too low to protect the wiring conductors of the board principal surfaces 11a and 11b. On the other hand, in the event of exceeding about 1 mm, the strength of the protruding portions 12s, 12t, and 12k becomes weak, resulting in a problem wherein the protruding portions 12s, 12t, and 12k are lost, which is undesirable.

The restraint layers for forming the protruding portions are configured such as shown in FIGS. 5A, 5B and FIGS. 6A, 6B.

Figure 5A:
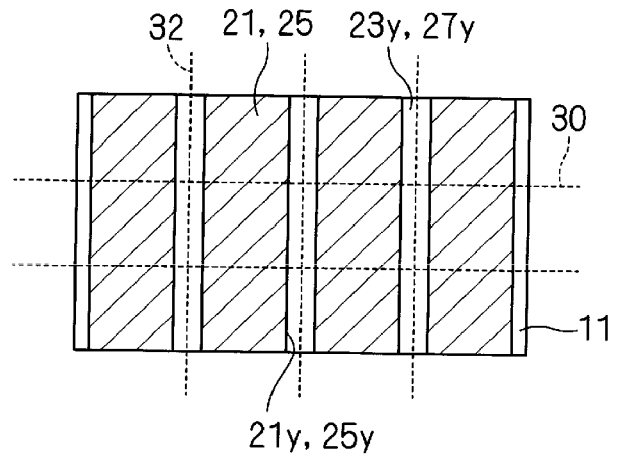
FIG. 5A is an explanatory diagram illustrating the layout of restraint layers.
Figure 5B:
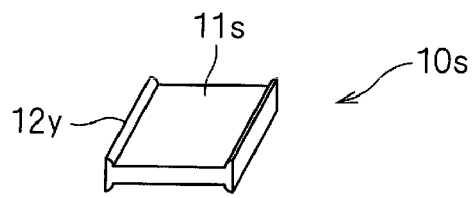
FIG. 5B is a perspective view of a multilayer ceramic board.

The contraction prevention green sheets 21 and 25 serving as the restraint layers 22 and 26 are disposed and pressure-bonded to the board ceramic green sheet 11 defining the principal surface of the base layer 12 such as shown with oblique lines in the plane view in FIG. 5A, for example. That is to say, with the contraction prevention green sheets 21 and 25 which are pressure-bonded to the board ceramic green sheet 11, belt-shaped gaps (slits) 23y and 27y are formed along the one dividing line 32 of dividing lines 30 and 32 for dividing corresponding to the individual pieces of the multilayer ceramic board 10, thereby preventing the two sides facing each other of the rectangular region of each child board partitioned with the dividing lines 30 and 32, and the nearby portion thereof from being pressure-bonded with the contraction prevention green sheets 21 and 25. With a multilayer ceramic board 10s fabricated by thus disposing the contraction prevention green sheets 21 and 25, as shown in the perspective view in FIG. 5B, a protruding portion 12y is formed, which has a continuous wall shape along the two sides facing each other of a rectangular principal surface 11s.

Figure 6A:
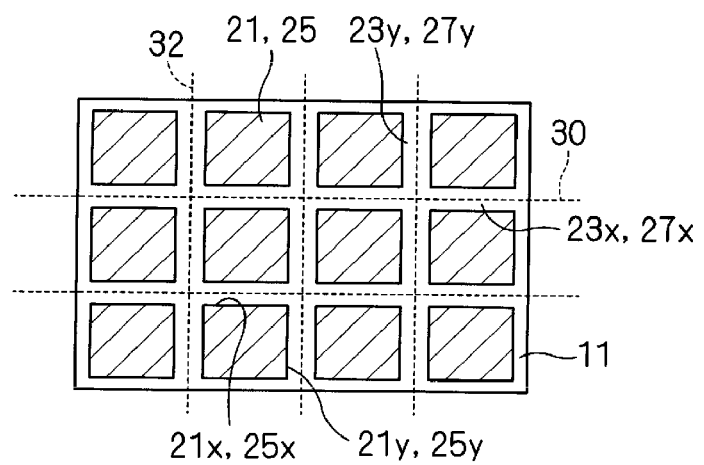
FIG. 6A is an explanatory diagram illustrating the layout of restraint layers.

As shown in the plan view in FIG. 6A, an arrangement may be made wherein with the contraction prevention green sheets 21 and 25 which are pressure-bonded to the board ceramic green sheet 11, belt-shaped gaps (slits) 23x, 23y; 27x, 27y are formed along both dividing lines 30 and 32, thereby preventing the four sides of the rectangular region of each child board partitioned with the dividing lines 30 and 32, and the nearby portion thereof from being pressure-bonded with the contraction prevention green sheets 21 and 25. With a multilayer ceramic board 10t fabricated by thus disposing the contraction prevention green sheets 21 and 25, as shown in the perspective view in FIG. 6B, protruding portions 12x and 12y are formed, which are continuous in a wall shape along the four sides of a rectangular principal surface 11t.

Figure 6B:
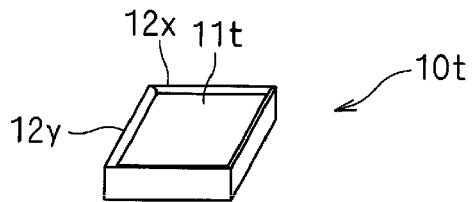
FIG. 6B is a perspective view of a multilayer ceramic board. (Example 2)

In the case of FIGS. 6A and 6B, gaps (slits) 23x, 23y; 27x, 27y are preferably formed such that the outer circumferential edges 21x, 21y; 25x, 25y of the contraction prevention green sheets 21 and 25 are positioned about 10 μm to about 5 mm apart from the dividing lines 30 and 32. In the event that the gaps (slits) 23x, 23y; 27x, 27y are formed such that the outer circumferential edges 21x, 21y; 25x, 25y of the contraction prevention green sheets 21 and 25 are positioned less than about 10 μm from the dividing lines 30 and 32, the exposure amount of the board ceramic green sheet 11 of the base layer 12 is small, so the protrusion of the protruding portions 12x and 12y of the multilayer ceramic board 10t becomes small, and accordingly, it is difficult to form the protruding portions 12x and 12y sufficiently protruding so as to protect the wiring conductors (not shown) formed on the principal surface 11t of the multilayer ceramic board 10t. Also, in the event that the outer circumferential edges 21x, 21y; 25x, 25y of the contraction prevention green sheets 21 and 25 are positioned at a distance exceeding about 5 mm from the dividing lines 30 and 32, the board ceramic green sheet 11 is exposed too much, the multilayer ceramic board 10t is contracted greatly in the X-Y direction, and accordingly, the dimensional accuracy of the multilayer ceramic board 10t deteriorates.

In the case of FIGS. 5A and (b), as with FIGS. 6A and (b), the gaps (slits) 23y and 27y are preferably formed such that the outer circumferential edges 21y and 25y of the contraction prevention green sheets 21 and 25 are positioned about 10 μm to about 5 mm apart from the dividing line 32.

Note that the shape and layout of the contraction prevention green sheets 21 and 25 which are pressure-bonded to the board ceramic green sheet 11 of the base layer 12 are not restricted to those. For example, with the contraction prevention green sheets 21 and 25 which are pressure-bonded to the board ceramic green sheet 11 of the base layer 12, in the event that a belt-shaped gap is formed along a dividing line serving as one direction and also only at the single side regarding the dividing line thereof, a protruding portion which is continuous in a wall shape can be formed only at one side of the principal surface of a ceramic multilayer board. Also, in the event that gaps are formed intermittently along a dividing line, a protruding portion can be formed only at a portion of the side of the principal surface of a ceramic multilayer board.

EXAMPLE 1

Description will be made regarding Example 1 wherein a multilayer ceramic board is manufactured one at a time with reference to the cross-sectional view in FIGS. 8A and 8B.

First, an organic binder and a solvent toluene are added to ceramic insulating material powder in which glass powder in which $SiO_2$, $CaO$, $Al_2O_3$, and $B_2O_3$ are mixed, and alumina powder are mixed with the same weight ratio, which is mixed by a ball mill, and is subjected to defoaming processing under reduced pressure to obtain slurry.

Note that as for ceramic insulating material powder, using materials normally used for the multilayer ceramic board is sufficient, but in the event that this includes glass or crystallization glass, sintering can be performed at relatively low temperature, whereby the range of selection of inorganic material powder to be included in a contraction prevention layer is greater.

With regard to organic vehicles, such as an organic binder, a solvent, a plasticizer, and the like, that which is usually used can be used and there is no need to provide any particular restrictions.

Next, the slurry is molded in a sheet shape on a carrier film using a casting method using a doctor blade to fabricate an approximately 0.1-mm-thick ceramic green sheet. This ceramic green sheet is dried, which is subsequently punched out to fabricate a board ceramic green sheet whose plane dimensions are approximately 100 mm×100 mm, for example. Note that the sintering temperature of the ceramic insulating material powder included in the board ceramic green sheet was about 850° C. At this time, the ceramic green sheet may be punched out following being separated from the carrier film, or may be separated from the carrier film following being punched out along with the carrier film in a state of being formed on the carrier film.

The step for applying electroconductive paste, such as Ag, Ag—Pt, Ag—Pd or the like serving as a wiring conductor, to the board ceramic green sheet by screen printing or the like as necessary, or providing a through hole and filling up this through hole with electroconductive paste is carried out.

Subsequently, the five board ceramic green sheets are layered to fabricate a raw multilayer board (base layer, layered body) including a ceramic green layer.

Next, an organic binder and a solvent toluene are added to alumina powder serving as inorganic material powder, which is mixed by a ball mill, and is subjected to defoaming processing under reduced pressure to obtain slurry. Note that as for inorganic material powder, what is not sintered at the sintering temperature of the ceramic insulating material powder included in the ceramic green sheet for the sake of the ceramic green layer is used. Also, with regard to organic vehicles, such as an organic binder, a solvent, a plasticizer, and the like, that which is usually used can be used and there is no need to provide any particular restrictions. The slurry is molded in a sheet shape on a carrier film using a casting method using a doctor blade to fabricate an approximately 0.1-mm-thick restraint ceramic green sheet (contraction prevention green sheet). The sintering temperature of inorganic material powder was about 1600° C.

Figure 8A:
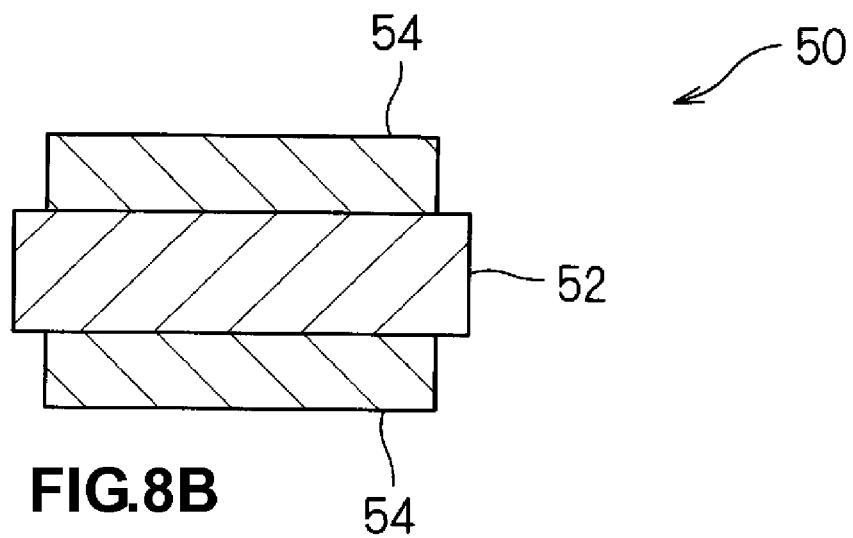
FIGS. 8A and 8B are explanatory diagrams of the manufacturing process of the multilayer ceramic board. (Example 1)

Next, a raw compound layered body 50 shown in FIG. 8A is formed. That is to say, a raw multilayer board is cut into approximately 3-mm squares. Also, the contraction prevention green sheet is cut into approximately 2.9-mm squares (groove width is about 0.2 mm) by a laser. At this time, the contraction prevention green sheet may be cut following being separated from the carrier film, or may be separated from the carrier film following being cut together with the carrier film in a state of being formed on the carrier film. Subsequently, the two contraction prevention green sheets 54 which were cut into approximately 2.9-mm squares are each layered on the upper and lower surfaces of the raw multilayer board 52 that was cut into 3-mm squares so as to obtain even gaps along the outer circumferential edge of the raw multilayer board 52, and are subjected to pressure-bonding at about 50 MPa using a pressing machine to fabricate the raw compound layered body 50.

Subsequently, this raw compound base layer 50 is disposed in a baking case, and is baked under a condition wherein the above-mentioned ceramic insulating material powder is sintered, but the above-mentioned inorganic material powder is not sintered. Specifically, the raw compound layered body 50 was baked at about 900° C., and only the multilayer grouped board (base layer) portion of the compound base layer was sintered.

Subsequently, the unsintered contraction prevention layer disposed on the upper and lower surfaces are eliminated by a brush or the like to extract a multilayer ceramic board from the baked multilayer grouped board.

Figure 8B:
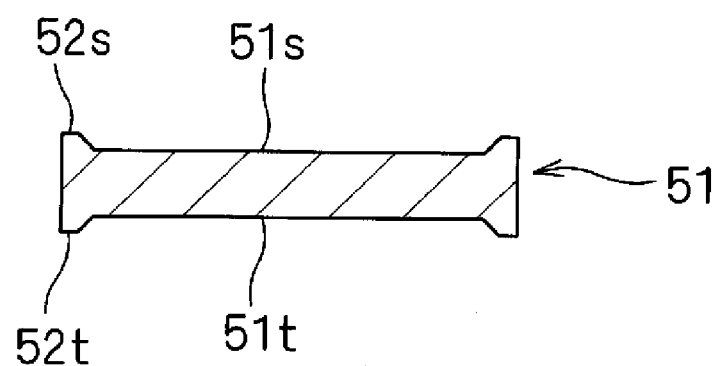

With the extracted multilayer ceramic board, as shown in FIG. 8B, wall-shaped protruding portions 52s and 52t were formed around the principal surfaces 51s and 51t of the multilayer ceramic board 51, and the height of the protruding portions 52s and 52t was about 25 μm from the principal surface center of the multilayer ceramic board 53.

EXAMPLE 2

As shown in FIGS. 6A and 6B and FIGS. 7A-7F, description will be made regarding Example 2 wherein a plurality of multilayer ceramic boards are simultaneously manufactured in a grouped state.

First, an organic binder and a solvent toluene are added to ceramic insulating material powder in which glass powder in which $SiO_2$, CaO, $Al_2O_3$, and $B_2O_3$ are mixed, and alumina powder are mixed with the same weight ratio, which is mixed by a ball mill, and is subjected to defoaming processing under reduced pressure to obtain slurry.

Note that, for the ceramic insulating material powder, using materials normally used for the multilayer ceramic board is sufficient, but in the event that this includes glass or crystallization glass, sintering can be performed at relatively low temperature, whereby the range of selection of inorganic material powder to be included in the contraction prevention layer is greater.

With regard to organic vehicles, such as an organic binder, a solvent, a plasticizer, and the like, that which is usually used can be used and there is no need to provide any particular restrictions.

Next, the slurry is molded in a sheet shape on a carrier film using a casting method using a doctor blade to fabricate an approximately 0.1-mm-thick ceramic green sheet. This ceramic green sheet is dried, and subsequently is punched out to fabricate a board ceramic green sheet whose plane dimensions are approximately 100 mm×100 mm, for example. Note that the sintering temperature of the ceramic insulating material powder included in the board ceramic green sheet was about 850° C.

The step for applying electroconductive paste, such as Ag, Ag—Pt, Ag—Pd or the like serving as a wiring conductor, to the board ceramic green sheet by screen printing or the like as necessary, or providing a through hole and filling up this through hole with electroconductive paste is carried out.

Subsequently, the five board ceramic green sheets are layered to fabricate a raw multilayer board (base layer, layered body) including a ceramic green layer.

Next, an organic binder and a solvent toluene are added to alumina powder serving as inorganic material powder, which is mixed by a ball mill, and is subjected to defoaming processing under reduced pressure to obtain slurry. Note that, for the inorganic material powder, what is not sintered at the sintering temperature of the ceramic insulating material powder included in the ceramic green sheet for the sake of the ceramic green layer is used. Also, with regard to organic vehicles, such as an organic binder, a solvent, a plasticizer, and the like, that which is usually used can be used and there is no need to provide any particular restrictions. The slurry is molded in a sheet shape on a carrier film using a casting method using a doctor blade to fabricate an approximately 0.1-mm-thick restraint ceramic green sheet (contraction prevention green sheet). The sintering temperature of inorganic material powder was about 1600° C.

Next, the restraint ceramic green sheet surface is cut into approximately 2.9-mm squares (groove width is about 0.2 mm), two of which are each layered on the upper and lower surfaces of the ceramic green sheet serving as the board portion, and are subjected to temporary pressure-bonding at about 20 MPa using a pressing machine to fabricate a raw compound base layer (compound layered body).

Subsequently, the raw compound base layer is divided into around 3-mm squares along a dividing line using a knife edge or dicing saw or the like. The divided raw compound base layers are subjected to full pressure-bonding at about 50 MPa. According to this full pressure-bonding, the major portion of the completely divided raw compound base layers will be joined at the divided surfaces again.

Subsequently, this raw compound base layer is disposed in a baking case, and is baked under a condition wherein the ceramic insulating material powder is sintered, but the inorganic material powder is not sintered. Specifically, the raw compound layered body 50 was baked at about 900° C., and only the multilayer grouped board (base layer) portion of the compound base layer was sintered.

The multilayer grouped board is divided into a plurality of multilayer ceramic boards at the divided surfaces during baking.

Subsequently, the unsintered contraction prevention layer disposed on the upper and lower surfaces are eliminated by a brush or the like to extract a multilayer ceramic board from the baked multilayer grouped board.

With the multilayer ceramic board, a wall-shaped protruding portion is formed on the circumference of the principal surface thereof. Specifically, the height of the protruding portion was about 25 μm from the principal surface center of the multilayer ceramic board.

EXAMPLE 3

Description will be made regarding a lumped constant type isolator 111 serving as a nonreciprocal circuit element including a multilayer ceramic board 100 fabricated in the same way as Example 2 with reference to the exploded perspective view in FIG. 9.

Figure 9:
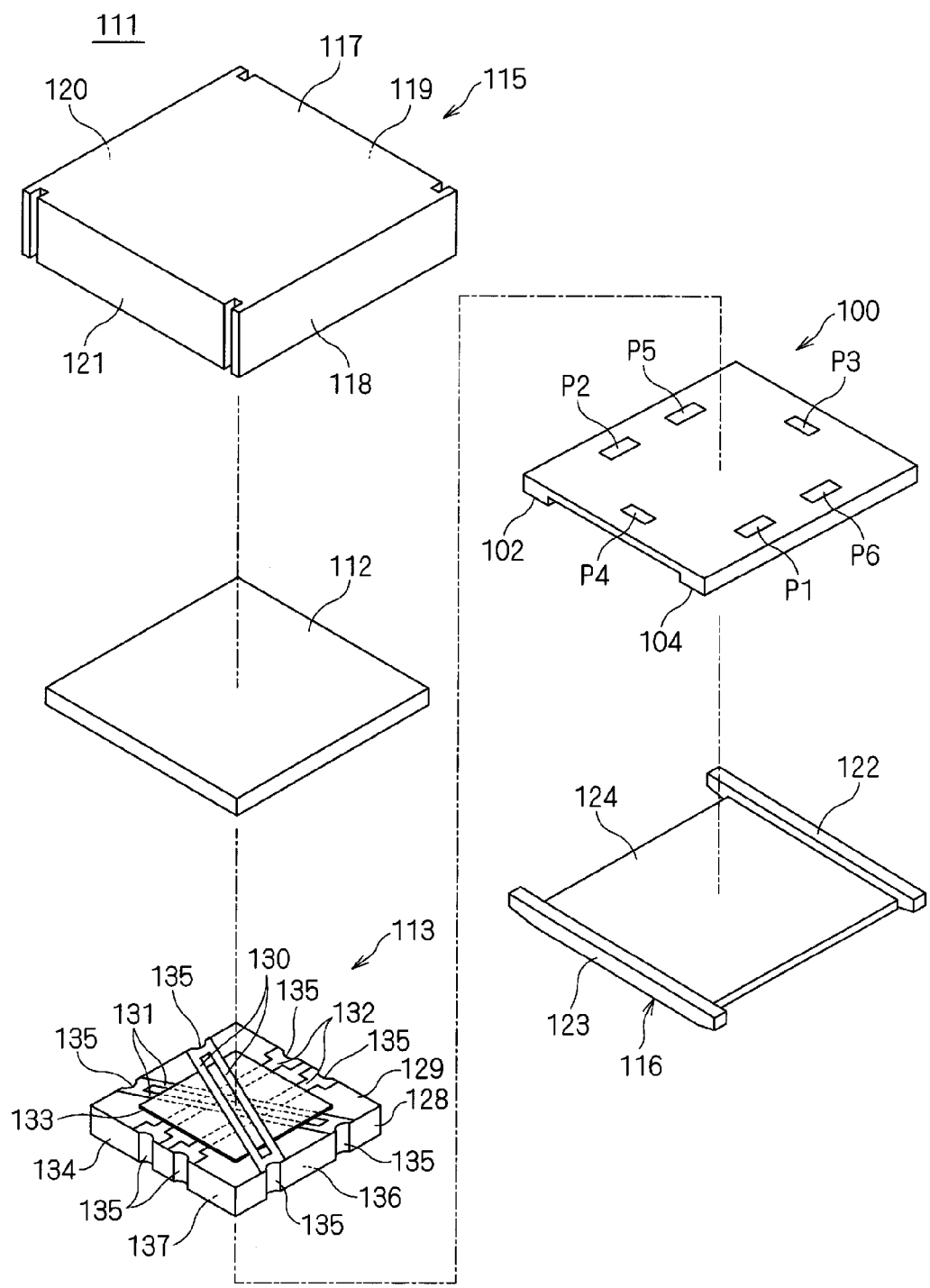
FIG. 9 is an exploded perspective view of a lumped constant type isolator. (Example 3)

As shown in FIG. 9, the lumped constant type isolator 111 includes a substantially rectangular-plate-shaped permanent magnet 112, a center electrode assembly 113, a multilayer ceramic board 100 for mounting, an upper-side case 115 and lower-side case 116 defining metal cases.

The upper-side case 115 has a box shape including an opening facing downward, and includes an upper wall portion 117, and four side wall portions 118 through 121. The lower-side case 116 includes two rising walls 122 and 123 facing each other, and a bottom wall portion 124 connecting between these rising walls 122 and 123. The upper-side case 115 and the lower-side case 116 are preferably formed of a ferromagnetic material, and the surface thereof is subjected to Ag or Cu plating.

The multilayer ceramic board 100 has a multilayer configuration including a plurality of ceramic layers which are layered, and a matching capacitor element and a resistance element are built in a wiring conductor disposed between the ceramic layers.

On the upper surface of the multilayer ceramic board 100 port electrodes P1, P2, and P3, and ground electrodes P4, P5, and P6 are exposed. On the lower surface of the multilayer ceramic board 100, though not shown in FIG. 9, an input electrode and an output electrode which electrically connect this isolator 111 to an external circuit are provided. Also, the lower surface of the multilayer ceramic board 100 includes protruding portions 102 and 104 which are continuous in a wall shape along the two sides facing each other.

The center electrode assembly 113 includes a base 128 made up of a microwave ferrite having a substantially rectangular plate shape. On the upper surface of the base 128 three center electrodes 130, 131, and 132 are disposed. These center electrodes 130 through 132 are mutually electrically insulated by an electrical insulating layer 133 disposed between the three center electrodes. Also, the three center electrodes 130 through 132 are disposed so as to cross each other generally at about 120 degrees.

The sequence for disposing the center electrodes 130 through 132 is arbitrary, but with the example shown in FIG. 9, the center electrode 132, electrical insulating layer 133, center electrode 131, electrical insulating layer 133, and center electrode 130 are disposed in this sequence from the bottom.

Each of first ends of these center electrodes 130 through 132 is connected to a ground electrode 137 disposed on the lower surface 136 of the base 128 via a connection electrode 135 located on the side surface 134 of the base 128, and each of the other ends is connected to the port electrodes P1 through P3 of the multilayer ceramic board 100 via the connection electrode 135 located on the side surface 134.

Thus, the ground side of the center electrodes 130 through 132 is connected to a common ground electrode 137 via the connection electrode 135. This common ground electrode 137 has generally the same shape as the lower surface 136 of the base 128, and coats generally the entire surface of the lower surface 136 so as to avoid contact with the port electrodes P1 through P3 formed on the multilayer ceramic board 100. Also, the ground electrode 137 is connected to the ground electrodes P4, P5, and P6 of the multilayer ceramic board 100.

In the event of assembling the lumped constant type isolator 111 using the components, first the multilayer ceramic board 100 is built in the lower-side case 116, the center electrode assembly 113 is mounted thereupon, thereby establishing predetermined electrical connection. On the other hand, the permanent magnet 112 is disposed on the lower side of the wall portion 117 of the upper-side case 115. Subsequently, while maintaining these states, between the upper-side case 115 and the lower-side case 116 is joined, thereby forming an integral metal case.

When assembled as described above, the permanent magnet 112 applies a DC magnetic field to the center electrode assembly 113. At this time, the metal case including the upper-case 115 and the lower-case 116 defines a magnetic circuit, and also serves as a yoke.

The multilayer ceramic board 100 can be effectively used particularly as a nonreciprocal circuit element. That is to say, the bottom wall portion 124 of the lower-side case 116 is fitted in between the protruding portions 102 and 104 of the lower surface of the multilayer ceramic board 100, thereby facilitating the positioning at the time of combining with ferrite, whereby positioning can be performed with high accuracy.

Second Preferred Embodiment

Next, description will be made regarding a method for manufacturing a multilayer ceramic board according to a second preferred embodiment of the present invention with reference to the cross-sectional view in FIGS. 10A-10F.

With the second preferred embodiment, the multilayer ceramic board 10 is manufactured in a grouped state generally in the same way as the first preferred embodiment. Description will be made below mainly regarding differences, using the same reference numerals regarding the same components as those in the first preferred embodiment.

Figure 10A:
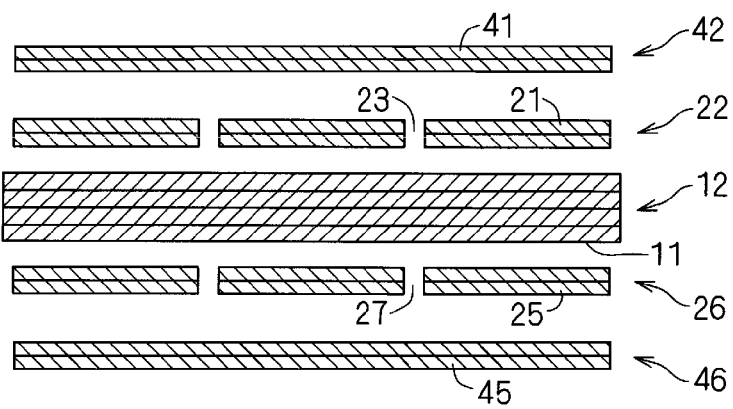
FIGS. 10A-10F is an explanatory diagram of the manufacturing process of a multilayer ceramic board.

First, as shown in FIG. 10A, the base layer 12 serving as a layered body wherein a plurality of board ceramic green sheets 11 are layered, the restraint layers 22 and 26 including one or two or more contraction prevention green sheets 21 and 25, and whole restraint layers 42 and 46 including one or two or more whole restraint green sheets 41 and 45 are prepared.

The whole restraint green sheets 41 and 45 are unsintered green sheets molded in a sheet shape in the same way as the contraction prevention green sheets 21 and 25. However, with the whole restraint green sheets 41 and 45, gaps 23 and 27 are not formed, which is different from the contraction prevention green sheets 21 and 25. The whole restraint green sheets 41 and 45 are fabricated with the same material as the contraction prevention green sheets 21 and 25, include inorganic material powder such as alumina or the like which is not sintered at the baking temperature of the board ceramic green sheet 11, and accordingly are not sintered at the sintering temperature of the board ceramic green sheet 11 substantially.

Figure 10B:
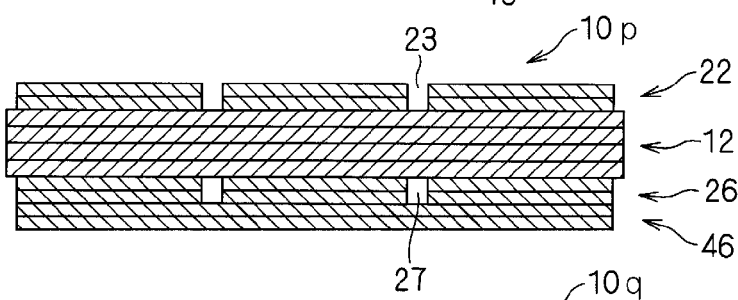

Next, as shown in FIG. 10B, the restraint layers 22 and 26 are layered on both principal surfaces of the base layer 12, following which a whole restraint layer 46 is further layered on the one principal surface, relatively small pressure is applied to the layering direction, thereby forming a temporarily pressure-bonded compound layered body 10*p*. Note that instead of subjecting the entire compound layered body 10*p* to temporary pressure-bonding integrally, the respective layers and green sheets may be subjected to temporary pressure-bonding in an appropriate sequence.

Figure 10C:
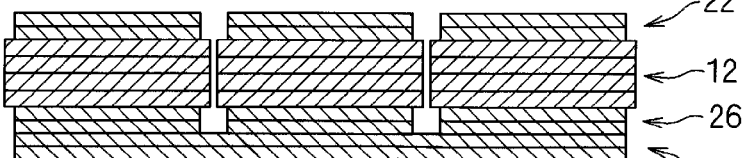

Subsequently, as shown in FIG. 10C, the base layer 12 is divided along dividing lines for dividing corresponding to the individual pieces of the multilayer ceramic board 10 from the other principal surface of the temporarily pressure-bonded compound layered body 10*p*. At this time, a compound layered body 10*q* wherein only the base layer 12 is divided so as not to divide the whole restraint layer 46 is formed.

Figure 10D:
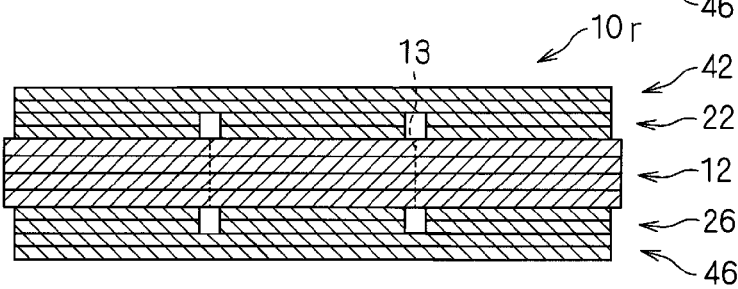

Subsequently, the whole restraint layer 42 is layered on the other principal surface of the compound layered body 10*q* which divided the base layer 12, relatively great pressure is applied to the layering direction, the base layer 12, restraint layers 22 and 26, and the whole restraint layers 42 and 46 are subjected to full pressure-bonding, thereby forming a compound layered body 10*r* shown in FIG. 10D. At this time, an area between the divided surfaces 13 of the base layer 12 does not need to be joined but facing each other such as shown in the drawing, which differs from the case of the first preferred embodiment. This is because the compound layered body 10*r* is integrated with the whole restraint layers 42 and 46 even if between the divided surfaces 13 of the base layer 12 is separated. Note that as long as the whole restraint layer is formed at least on the one principal surface of the compound layered body 10*q*, full pressure-bonding is performed without providing the whole restraint layer 42 on the other principal surface, and the fully pressure-bonded compound layered body 10*r* having no whole restraint layer 42 may be formed.

Figure 10E:
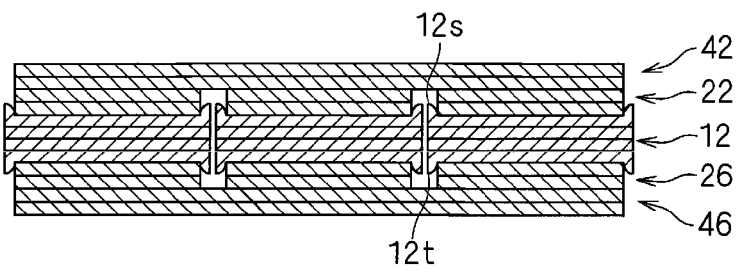

Subsequently, the fully pressure-bonded compound layered body 10*r* is subjected to baking. Baking is performed under a condition wherein the ceramic material powder included in the board ceramic green sheet 11 of the base layer 12 is sintered, but the inorganic material powder included in the contraction prevention green sheets 21 and 25 and the whole restraint green sheets 41 and 45 of the restraint layers 22 and 26 and the whole restraint layers 42 and 46 is not sintered. That is to say, baking is performed at a temperature higher than the baking temperature of the board ceramic green sheet 11 of the base layer 12, and also lower than the baking temperature of the contraction prevention green sheets 21 and 25 and the whole restraint green sheets 41 and 45 of the restraint layers 22 and 26 and the whole restraint layers 42 and 46. According to baking, as shown in FIG. 10E, with the base layer 12, the protruding portions 12s and 12t are formed at the portion to which the restraint layers 22 and 26 are not pressure-bonded, and also the base layer 12 is separated at the divided surfaces 13 during baking or after baking.

Figure 10F:
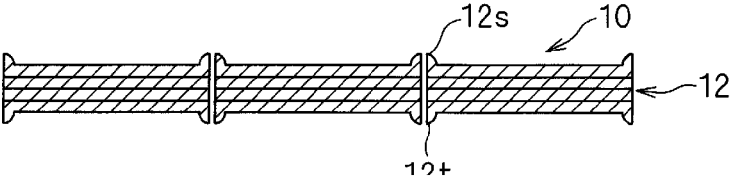

Subsequently, the restraint layers 22 and 26, and the whole restraint layers 42 and 46 are removed from the base layer 12, thereby extracting a baked multilayer ceramic board 10 shown in FIG. 10F.

The manufacturing method according to the second preferred embodiment facilitates handling in the manufacturing steps by an arrangement wherein even if the base layer 12 is divided at the dividing lines, the whole restraint layer 46 prevents the individual pieces from separating.

Third Preferred Embodiment

Description will be made regarding a method for manufacturing a multilayer ceramic board according to a third preferred embodiment of the present invention with reference to FIG. 11A through FIG. 14B. With the third preferred embodiment, a multilayer ceramic board is manufactured using a protruding portion forming layer. A multilayer ceramic board can be manufactured one at a time such as later-described Example 4, but now, description will be made regarding a case wherein a plurality of boards are simultaneously manufactured in a grouped state such as later-described Example 5 as an example.

First, description will be made regarding the outline of a method for manufacturing a multilayer ceramic board including a protruding portion forming layer with reference to the cross-sectional views in FIGS. 11A-11E.

Figure 11A:
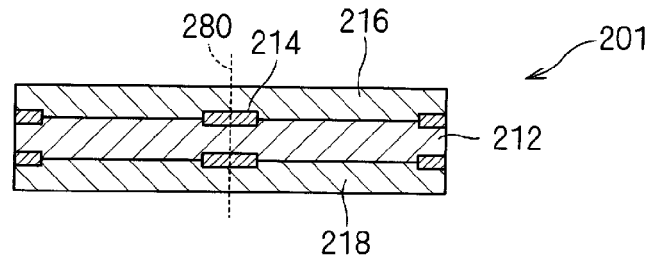
FIGS. 11A-11E is an explanatory diagram of the manufacturing process of a multilayer ceramic board. (Example 5)

As shown in FIG. 11A, a protruding portion forming layer 214 is formed on a base layer 212 serving as a layered body in which a plurality of board ceramic green sheets are layered, restraint layers 216 and 218 including one or two or more contraction prevention green sheets thereupon are disposed and subjected to temporary pressure-bonding to fabricate a compound layered body 201.

The board ceramic green sheet used for the base layer 212 is, as with the first preferred embodiment, an unsintered green sheet which was molded in a sheet shape, and includes ceramic material powder. With the board ceramic green sheet, a through hole (not shown) is processed with laser processing, punching processing, or the like at an appropriate position, and conductor paste is embedded in this through hole by printing or the like, thereby disposing a via conductor (not shown). Also, a wiring conductor (not shown) is disposed on one principal surface of the board ceramic green sheet by printing conductor paste using a screen printing method or gravure printing method or the like, or by transferring a predetermined pattern-shaped metallic foil, or the like.

The contraction prevention green sheets serving as the restraint layers 216 and 218 are, as with the first preferred embodiment, unsintered green sheets molded in a sheet shape. The contraction prevention green sheets include inorganic material powder such as alumina or the like which is not sintered at the baking temperature of the board ceramic green sheet, and are not substantially sintered at the sintering temperature of the board ceramic green sheet.

The protruding portion forming layer 214 is formed at least on one principal surface of the base layer 212, preferably on both principal surfaces along at least a portion of a dividing lines 280 for dividing corresponding to the individual pieces of the multilayer ceramic board; details will be described later. The protruding portion forming layer 214 is formed with paste including a material which burns up at the sintering temperature of the board ceramic green sheet using a printing method or transferring method or the like. As for a material which is burnt away at the sintering temperature of the board ceramic green sheet, carbon powder can be used, for example. Note that an arrangement may be made wherein the material, binder, and solvent are mixed to form a sheet-shaped layer, which is cut and disposed at a predetermined position, thereby forming a protruding portion forming layer.

The contraction prevention green sheet used for the restraint layers 216 and 218 is disposed on the base layer 212 and the protruding portion forming layer 214, which does not need to be cut along the dividing line 280 such as the first preferred embodiment.

Note that an arrangement may be made wherein the protruding portion forming layer 214 is formed on the contraction prevention green sheet used for the restraint layers 216 and 218 beforehand, the contraction prevention green sheet used for the restraint layers 216 and 218 is disposed on the base layer 212 such that the protruding portion forming layer 214 is overlapped with the base layer 212, and is subjected to temporary pressure-bonding, thereby forming the compound layered body 201.

Figure 11B:
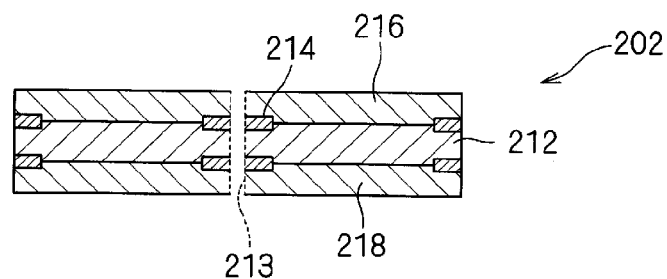

Subsequently, as shown in FIG. 11B, the compound layered body 201 wherein the restraint layers 216 and 218 are temporarily pressure-bonded to the base layer 212 is divided along the dividing lines 280 for dividing corresponding to the individual pieces of the multilayer ceramic board, thereby forming divided compound layered bodies 202.

Figure 11C:
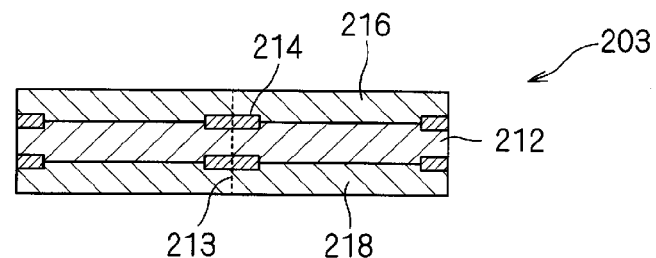
Figure 11D:
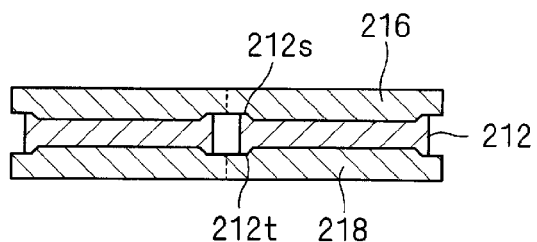

Subsequently, with the divided compound layered bodies 202, as shown in FIG. 11C, relatively great pressure is applied to the layering direction in a state in which the divided surfaces 213 are facing each other, the restraint layers 216 and 218 are fully pressure-bonded to the base layer 212, thereby forming a fully pressure-bonded compound layered body 203. Note that a dividing groove which does not divide the base layer 212 may be formed on at least the one principal surface of the base layer 212.

Subsequently, the compound layered body 203 wherein the restraint layers 216 and 218 have been fully pressure-bonded to the base layer 212 is subjected to baking. Baking is, as with the first preferred embodiment, performed under a condition wherein the ceramic material powder included in the board ceramic green sheet of the base layer 212 is sintered, but the inorganic material powder included in the contraction prevention green sheets of the restraint layers 216 and 218 is not sintered. That is to say, baking is performed at a temperature higher than the baking temperature of the board ceramic green sheet of the base layer 212, and also lower than the baking temperature of the contraction prevention green sheets of the restraint layers 216 and 218.

Due to baking, as shown in FIG. 1D, with the base layer 212, protruding portions 212s and 212t are formed at the portion where the protruding portion forming layer 213 is disposed, and also the base layer 212 is separated at the divided surfaces 213.

That is to say, the protruding portion forming layer 214 is burnt away during baking, and a gap is formed at the interface between the base layer 212 and the restraint layers 216 and 218. According to formation of a gap, the restraint force by the contraction prevention green sheets of the restraint layers 216 and 218 is not affected on the portion of the base layer 212 where the protruding portion forming layer 214 is disposed, and accordingly, this portion is contracted in three directions during baking. On the other hand, the restraint force by the contraction prevention green sheets of the restraint layers 216 and 218 is affected on the other portions of the base layer 212 other than the portion where the protruding portion forming layer 214 is disposed, and contraction in the surface direction is prevented, and accordingly, contraction in the direction perpendicular to the surface becomes great as compared with the portion where a gap has been formed by the protruding portion forming layer 214. Consequently, with the base layer 212, the protruding portions 212s and 212t are formed at the portion where a gap was formed by the protruding portion forming layer 214.

Also, there is the divided surface 213 of the base layer 212 at the portion where a gap is formed by the protruding portion forming layer 214, and the restraint force by the contraction prevention green sheets of the restraint layers 216 and 218 is not affected around the divided surface 213 of the base layer 212, and accordingly, with the base layer 212, each of both sides of the divided surface 213 attempts to contract in the direction apart from the divided surface 213. At this time, the base layer 212 is joined after being divided at the divided surface 213, so the composition thereof becomes discontinuous as to the other portions, and the strength in the joint direction between the divided surfaces 213 is weak as compared with the other portions, whereby the base layer 212 is separated at the divided surface 213 during baking or after baking. Note that even in the event that the base layer 212 is not separated at the divided surface 213 during baking or after baking, the base layer 212 is readily divided at the divided surface 213 after baking.

Figure 11E:
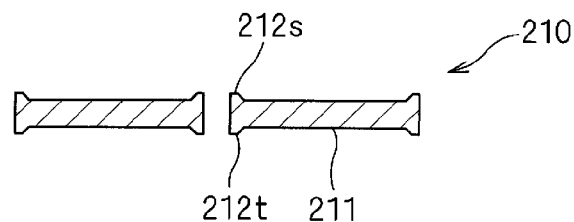

Subsequently, the restraint layers 216 and 218 are removed from the base layer 212 after baking, thereby extracting a baked multilayer ceramic board 212 shown in FIG. 11E.

The wiring conductors disposed between the board ceramic green sheet of the base layer 212 and the contraction prevention green sheets of the restraint layers 216 and 218 are exposed from the principal surface 211 of the multilayer ceramic boards 210. The multilayer ceramic boards 210 include a plurality of ceramic layers formed with the board ceramic green sheet, wiring conductors are formed between ceramic layers, and the wiring conductors are connected with a via conductor.

The protruding portion forming layer is formed as shown in FIGS. 12A and 12B or FIGS. 13A and 13B, for example.

Figure 12A:
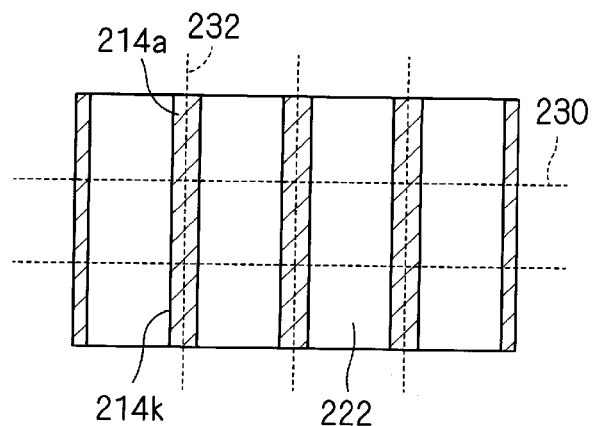
FIG. 12A is an explanatory diagram illustrating the layout of restraint layers.

As shown in the plan view in FIG. 12A, a protruding portion forming layer 214a appended with oblique lines is formed on the principal surface 222 of the board ceramic green sheet defining the principal surface of the base layer. That is to say, the protruding portion forming layer 214a is formed in a belt shape along the one dividing line 232 of the dividing lines 230 and 232 for dividing corresponding to the individual pieces of the multilayer ceramic board, thereby preventing the two sides facing each other of the substantially rectangular region of each child board partitioned with the dividing lines 230 and 232, and the nearby portion thereof from being in contact with the contraction prevention green sheets of the restraint layers directly. The restraint layer is disposed on the principal surface 222 where the protruding portion forming layer 214a is formed in a striped shape, and is subjected to baking, thereby fabricating a multilayer ceramic board 210s wherein a protruding portion 212k is formed, which is continuous in a wall shape along the two sides facing each other of a substantially rectangular principal surface 211s, as shown in the perspective view in FIG. 12B.

Figure 13A:
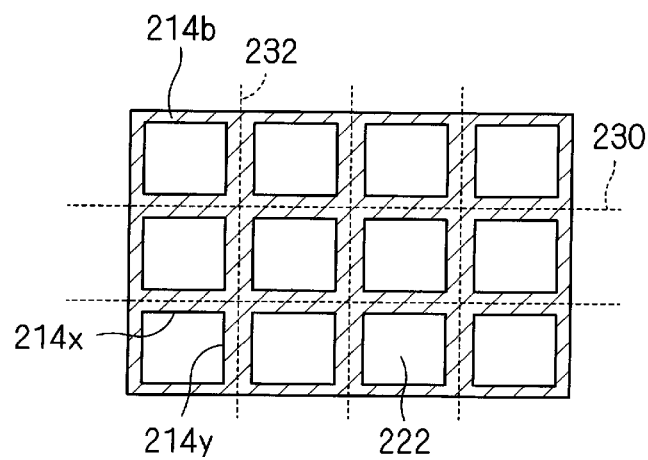
FIG. 13A is an explanatory diagram illustrating the layout of restraint layers.

Alternatively, as shown in the plan view in FIG. 13A, an arrangement may be made wherein a protruding portion forming layer 214b appended with oblique lines is formed along both dividing lines 230 and 232 on the principal surface 222 of the board ceramic green sheet defining the principal surface of the base layer, thereby preventing the four sides of the substantially rectangular region of each child board partitioned with the dividing lines 230 and 232, and the nearby portion thereof from being in contact with the contraction prevention green sheets of the restraint layers directly. The restraint layer is disposed on the principal surface 222 where the protruding portion forming layer 214b is formed in a latticed shape, and is subjected to baking, thereby fabricating a multilayer ceramic board 210t wherein protruding portions 212x and 212y are formed, which are continuous in a wall shape along the four sides of a substantially rectangular principal surface 211t, as shown in the perspective view in FIG. 13B.

Figure 13B:
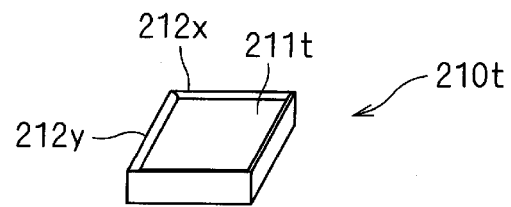
FIG. 13B is a perspective view of the multilayer ceramic board. (Example 5)

In the case of FIGS. 13A and 13B, the outer circumferential edges 214x and 214y of the protruding portion forming layer 214b are preferably formed so as to be positioned about 10 μm to about 5 mm apart from the dividing lines 230 and 232. In the event that the outer circumferential edges 214x and 214y of the protruding portion forming layer 214b are positioned less than about 10 μm from the dividing lines 230 and 232, the protrusion of the protruding portions 212x and 212y of the multilayer ceramic board 210t becomes small, and accordingly, it is difficult to form the protruding portions 212x and 212y so as to sufficiently protrude so as to protect the wiring conductors (not shown) formed on the principal surface 211t of the multilayer ceramic board 210t. Also, in the event that the outer circumferential edges 214x and 214y of the protruding portion forming layer 214b are positioned greater than about 5 mm from the dividing lines 230 and 232, the multilayer ceramic board 210t is contracted greatly in the X-Y direction, and accordingly, the dimensional accuracy of the multilayer ceramic board 210t deteriorates.

Figure 12B:
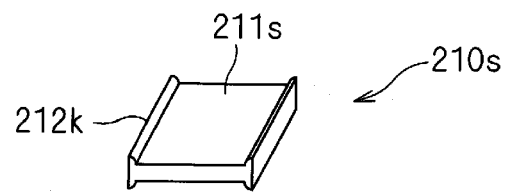
FIG. 12B is a perspective view of a multilayer ceramic board.

In the case of FIGS. 12A and 12B as well, as with the case of FIGS. 13A and 13B, the outer circumferential edge 214k of the protruding portion forming layer 214a is preferably formed so as to be positioned about 10 μm through about 5 mm apart from the dividing line 232.

Note that the shape and layout of the protruding portion forming layer are not restricted to those described above. For example, in the event that a belt shape is formed along a dividing line serving as one direction of the base layer and also only at the single side regarding the dividing line thereof, a protruding portion which is continuous in a wall shape can be formed only at one side of the principal surface of a ceramic multilayer board. Also, in the event that protruding portion forming layers are formed intermittently along a dividing line, a protruding portion can be formed only at a portion of the side of the principal surface of a ceramic multilayer board.

As described above, in the case of forming a protruding portion forming layer, there is no need to subject the contraction prevention green sheet to processing, whereby design flexibility becomes high, and manufacturing costs can be reduced as compared with the case of subjecting the contraction prevention green sheet to processing.

EXAMPLE 4

Description will be made regarding Example 4 wherein a multilayer ceramic board is manufactured one at a time with reference to the cross-sectional view in FIGS. 14A and 14B.

First, an organic binder and a solvent toluene are added to ceramic insulating material powder in which glass powder in which $SiO_2$, $CaO$, $Al_2O_3$, and $B_2O_3$ are mixed, and alumina powder are mixed with the same weight ratio, which is mixed by a ball mill, and is subjected to defoaming processing under reduced pressure to obtain slurry.

Note that as for ceramic insulating material powder, using materials normally used for the multilayer ceramic board is sufficient, but in the event that this includes glass or crystallization glass, sintering can be performed at relatively low temperature, whereby the range of selection of inorganic material powder to be included in a contraction prevention layer is greater.

With regard to organic vehicles, such as an organic binder, a solvent, a plasticizer, and the like, that which is usually used can be used and there is no need to provide any particular restrictions.

Next, the slurry is molded in a sheet shape on a carrier film using a casting method using a doctor blade to fabricate an approximately 0.1-mm-thick ceramic green sheet. This ceramic green sheet is dried, which is subsequently punched out to fabricate a board ceramic green sheet whose plane dimensions are approximately 100 mm×100 mm, for example. Note that the sintering temperature of the ceramic insulating material powder included in the board ceramic green sheet was about 850° C.

The step for applying electroconductive paste, such as Ag, Ag—Pt, Ag—Pd or the like serving as a wiring conductor, to the board ceramic green sheet by screen printing or the like as necessary, or providing a through hole and filling up this through hole with electroconductive paste is carried out.

Subsequently, the five board ceramic green sheets are layered to fabricate a raw multilayer board (base layer, layered body) including a ceramic green layer.

Next, an organic binder and a solvent toluene are added to alumina powder serving as inorganic material powder, which is mixed by a ball mill, and is subjected to defoaming processing under reduced pressure to obtain slurry. Note that as for inorganic material powder, what is not sintered at the sintering temperature of the ceramic insulating material powder included in the ceramic green sheet for the sake of the ceramic green layer is used. Also, with regard to organic vehicles, such as an organic binder, a solvent, a plasticizer, and the like, that which is usually used can be used and there is no need to provide any particular restrictions. The slurry is molded in a sheet shape on a carrier film using a casting method using a doctor blade to fabricate an approximately 0.1-mm-thick restraint ceramic green sheet (contraction prevention green sheet). The sintering temperature of inorganic material powder was about 1600° C.

Figure 14A:
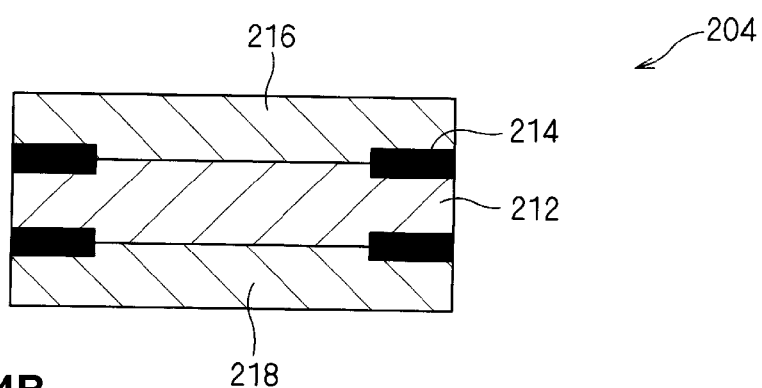
FIGS. 14A and 14B are explanatory diagrams of the manufacturing process of a multilayer ceramic board. (Example 4)

Next, a raw compound layered body 204 shown in FIG. 14A is formed. That is to say, a raw multilayer board and a contraction prevention green sheet are divided into approximately 3-mm squares, for example. Carbon paste is screen-printed with about 0.1-mm width on the outer circumference of both principal surfaces of the raw multilayer board 212 which were divided into individual pieces to form a protruding portion forming layer 214. Carbon paste is made up of carbon powder, terpineol serving as a solvent, and an epoxy resin as a binder. Subsequently, the contraction prevention green sheets 216 and 218 are layered on both principal surfaces of the raw multilayer grouped board 212 where the protruding portion forming layer 214 is formed, and are subjected to pressure-bonding at about 50 MPa using a pressing machine to fabricate the raw compound layered body.

Subsequently, this raw compound base layer is disposed in a baking case, and is baked under a condition wherein the ceramic insulating material powder is sintered, but the inorganic material powder is not sintered. Specifically, the raw compound layered body was baked at about 900° C., and only the multilayer grouped board (base layer) portion of the compound base layer was sintered.

Subsequently, the unsintered contraction prevention layer disposed on the upper and lower surfaces are eliminated by a brush or the like to extract a multilayer ceramic board from the baked multilayer grouped board.

Figure 14B:
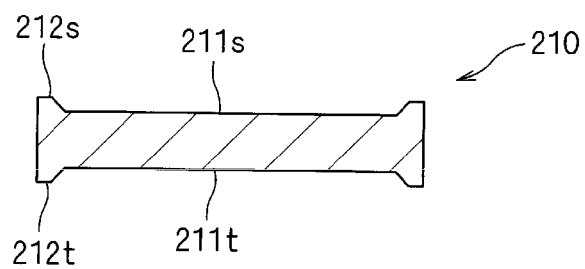

With the extracted multilayer ceramic board, as shown in FIG. 14B, wall-shaped protruding portions 212s and 212t were formed around the principal surfaces 211s and 212t of the multilayer ceramic board 210, and the height of the protruding portions 212s and 212t was about 25 μm from the principal surface 211s and 211t center of the multilayer ceramic board 210.

Note that with the present preferred embodiment, the protruding portion forming layers have been formed on both principal surfaces of the raw multilayer board, but may be formed only on one principal surface. Also, the protruding portion forming layers have been formed on the outer circumference of the raw multilayer board, but may be formed only on a portion of the outer circumference of the raw multilayer board such as a pair facing each other or the like, for example. Further, the raw multilayer protruding portion forming layer has been formed on the raw multilayer board by screen printing, but may be formed on the contraction prevention green sheet. Also, an arrangement may be made wherein a protruding portion forming layer is formed on a support beforehand, and this is transferred to the raw multilayer board or the contraction prevention green sheet.

EXAMPLE 5

As shown in FIGS. 11A-11E and FIGS. 13A and 13B, description will be made regarding Example 5 wherein a plurality of multilayer ceramic boards are simultaneously manufactured in a grouped state.

First, an organic binder and a solvent toluene are added to ceramic insulating material powder in which glass powder in which $SiO_2$, $CaO$, $Al_2O_3$, and $B_2O_3$ are mixed, and alumina powder are mixed with the same weight ratio, which is mixed by a ball mill, and is subjected to defoaming processing under reduced pressure to obtain slurry.

Note that as for ceramic insulating material powder, using materials normally used for the multilayer ceramic board is sufficient, but in the event that this includes glass or crystallization glass, sintering can be performed at relatively low temperature, whereby the range of selection of inorganic material powder to be included in a contraction prevention layer is greater.

With regard to organic vehicles, such as an organic binder, a solvent, a plasticizer, and the like, that which is usually used can be used and there is no need to provide any particular restrictions.

Next, the slurry is molded in a sheet shape on a carrier film using a casting method using a doctor blade to fabricate an approximately 0.1-mm-thick ceramic green sheet. This ceramic green sheet is dried, which is subsequently punched out to fabricate a board ceramic green sheet whose plane dimensions are approximately 100 mm×100 mm, for example. Note that the sintering temperature of the ceramic insulating material powder included in the board ceramic green sheet was about 850° C.

The step for applying electroconductive paste, such as Ag, Ag—Pt, Ag—Pd or the like serving as a wiring conductor, to the board ceramic green sheet by screen printing or the like as necessary, or providing a through hole and filling up this through hole with electroconductive paste is carried out.

Subsequently, the five board ceramic green sheets are layered to fabricate a raw multilayer board (base layer, layered body) including a ceramic green layer.

Next, an organic binder and a solvent toluene are added to alumina powder serving as inorganic material powder, which is mixed by a ball mill, and is subjected to defoaming processing under reduced pressure to obtain slurry. Note that as for inorganic material powder, that which is not sintered at the sintering temperature of the ceramic insulating material powder included in the ceramic green sheet for the sake of the ceramic green layer is used. Also, with regard to organic vehicles, such as an organic binder, a solvent, a plasticizer, and the like, that which is usually used can be used and there is no need to provide any particular restrictions. The slurry is molded in a sheet shape on a carrier film using a casting method using a doctor blade to fabricate an approximately 0.1-mm-thick restraint ceramic green sheet (contraction prevention green sheet). The sintering temperature of inorganic material powder was about 1600° C.

Next, carbon paste is screen-printed with about 0.1-mm width on the dividing lines of both principal surfaces of the raw multilayer board and both sides thereof to form a protruding portion forming layer. Subsequently, the contraction prevention green sheets are layered on both principal surfaces of the raw multilayer board where the protruding portion forming layers are formed, and are subjected to temporary pressure-bonding at about 20 MPa to fabricate a raw multilayer grouped board.

Subsequently, the raw compound base layer is divided into approximately 3-mm squares along a dividing line using a knife edge or dicing saw or the like. The divided raw compound base layers are subjected to full pressure-bonding at about 50 MPa. According to this full pressure-bonding, the major portion of the completely divided raw compound base layers will be joined at the divided surfaces again.

Subsequently, this raw compound base layer is disposed in a baking case, and is baked under a condition wherein the ceramic insulating material powder is sintered, but the inorganic material powder is not sintered. Specifically, the raw compound layered body was baked at about 900° C., and only the multilayer grouped board (base layer) portion of the compound base layer was sintered.

Subsequently, the unsintered contraction prevention layer disposed on the upper and lower surfaces are eliminated by a brush or the like to extract a multilayer ceramic board from the baked multilayer grouped board.

With the multilayer ceramic board, a wall-shaped protruding portion is formed on the circumference of the principal surface thereof. Specifically, the height of the protruding portion was about 25 μm from the principal surface center of the multilayer ceramic board.

Note that with the present preferred embodiment, the protruding portion forming layers have been formed on both principal surfaces of the raw multilayer board, but may be formed only on the one principal surface. Also, the protruding portion forming layers have been formed on the dividing lines of the raw multilayer grouped board and the nearby portion thereof, but may be formed only on a portion of the dividing lines and the nearby portion thereof. Further, the multilayer protruding portion forming layer has been formed on the raw multilayer board by screen printing, but may be formed on the contraction prevention green sheet. Also, an arrangement may be made wherein a protruding portion forming layer is formed on a support beforehand, and this is transferred to the raw multilayer board or the contraction prevention green sheet.

As described above, with regard to the multilayer ceramic board fabricated by non-contraction process, protruding portions are formed, whereby wiring conductors formed on the principal surface of the multilayer ceramic board can be prevented from being damaged.

Note that the present invention is not restricted to the above-described preferred embodiments, and can be implemented even if various modifications are applied thereto.

With the above-described preferred embodiments, the multilayer ceramic boards preferably are fabricated using a layered body in a grouped state, but an arrangement may be made wherein a contraction prevention green sheet is disposed on layered bodies which have been already divided into individual pieces to form compound layered bodies divided into individual pieces, thereby fabricating multilayer ceramic boards.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a multilayer ceramic board, comprising the steps of:

disposing on at least one principal surface of a layered body including a plurality of board ceramic green sheets including ceramic material powder, a contraction prevention green sheet including inorganic material powder which is not sintered at a baking temperature of said board ceramic green sheets to form a compound layered body;

baking said compound layered body under a condition in which said ceramic material powder is sintered, and said inorganic material powder is not sintered; and removing from said baked compound layered body said contraction prevention green sheet which has not been sintered; wherein said disposing step includes a step of disposing said contraction prevention green sheet such that along at least a portion of an outer circumference of a surface of said board ceramic green sheet of said layered body that is in contact with said contraction prevention green sheet, said portion and a nearby portion thereof are not directly in contact with said contraction prevention green sheet; and in said baking step, a protruding portion which protrudes in a vertical direction of said principal surface is formed at said portion and said nearby portion.

2. The method for manufacturing a multilayer ceramic board according to claim 1, wherein in said disposing step, said contraction prevention green sheet is disposed such that said portion and said nearby portion are exposed.

3. The method for manufacturing a multilayer ceramic board according to claim 2, wherein in said disposing step, said compound layered body is formed in a grouped state, and on said surface of said board ceramic green sheet of said layered body in a grouped state, which is in contact with said contraction prevention green sheet, said contraction prevention green sheet is disposed such that a weakening portion, which is formed along at least a portion of dividing lines provided for dividing said layered body in a grouped state into individual pieces, for weakening the junction strength between said pieces, and a nearby portion thereof are exposed.

4. The method for manufacturing a multilayer ceramic board according to claim 3, wherein in said disposing step, on the surface of said board ceramic green sheet of said layered body in a grouped state, which is in contact with said contraction prevention green sheet, said contraction prevention green sheet is disposed apart from said dividing lines.

5. The method for manufacturing a multilayer ceramic board according to claim 3, wherein in said disposing step, after dividing said layered body formed in a grouped state along said dividing lines, said weakening portion is formed by subjecting said layered body to pressure-bonding in the layering direction of said layered body.

6. The method for manufacturing a multilayer ceramic board according to claim 5, wherein in said disposing step, following a first whole restraint green sheet being disposed so as to cover said contraction prevention green sheet disposed on said one principal surface, said layered body is divided along said dividing lines, and a second whole restraint green sheet is disposed at the other principal surface side of said layered body, and is subjected to pressure-bonding, thereby forming said compound layered body having said weakening portion.

7. The method for manufacturing a multilayer ceramic board according to claim 3, wherein in said disposing step, a groove is formed from one principal surface or both principal surfaces of said layered body on said layered body in a grouped state along said dividing lines, thereby forming said weakening portion.

8. The method for manufacturing a multilayer ceramic board according to claim 3, wherein said dividing lines are arranged in a longitudinal direction and in a transversal direction so as to mutually intersect.

9. The method for manufacturing a multilayer ceramic board according to claim 3, wherein in said disposing step, said contraction prevention green sheet is disposed about 10 μm to about 5 mm apart from said dividing lines.

10. The method for manufacturing a multilayer ceramic board according to claim 1, wherein in said disposing step, said contraction prevention green sheet is disposed, of the surface of said board ceramic green sheet of said layered body which is in contact with said contraction prevention green sheet, along at least of a portion of the outer circumference of said surface on said portion and said nearby portion thereof, via a protruding portion forming layer made up of material which is burned up at the baking temperature of said board ceramic green sheet.

11. The method for manufacturing a multilayer ceramic board according to claim 10, wherein in said disposing step, said compound layered body is formed in a grouped state, and said protruding portion forming layer is formed on at least a portion and a nearby portion of dividing lines provided for dividing said layered body in a grouped state into individual pieces, of the interface between said board ceramic green sheet of said layered body in a grouped state and said contraction prevention green sheet.

12. The method for manufacturing a multilayer ceramic board according to claim 11, wherein in said disposing step, following dividing said layered body in a grouped state along said dividing lines, said layered body formed in a grouped state is subjected to pressure-bonding in the layering direction of said layered body.

13. The method for manufacturing a multilayer ceramic board according to claim 11, wherein said dividing lines are arranged in a longitudinal direction and in a transversal direction so as to mutually intersect.

14. The method for manufacturing a multilayer ceramic board according to claim 11, wherein in said compound layered body forming step, said protruding portion forming layer is disposed in a range of about 10 μm to about 5 mm from said dividing lines.

15. The method for manufacturing a multilayer ceramic board according to claim 11, wherein said protruding portion forming layer is formed with carbon paste.

16. The method for manufacturing a multilayer ceramic board according to claim 1, wherein said protruding portion is formed on at least one side of at least one principal surface of said multilayer ceramic board, and a nearby portion thereof, and said protruding portion protrudes about 1 μm to about 1 mm in the vertical direction of said principal surface.

* * * * *